(12) United States Patent
Boehme

(10) Patent No.: US 12,424,838 B2
(45) Date of Patent: Sep. 23, 2025

(54) SAFETY DEVICE FOR AN ELECTRIC DC GRID, ONBOARD ELECTRICAL SYSTEM FOR A VEHICLE, VEHICLE, AND DC CHARGING STATION

(71) Applicant: MERCEDES-BENZ GROUP AG, Stuttgart (DE)

(72) Inventor: Urs Boehme, Ehningen (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 24 days.

(21) Appl. No.: 18/292,373

(22) PCT Filed: Jul. 26, 2022

(86) PCT No.: PCT/EP2022/070890
§ 371 (c)(1),
(2) Date: Jan. 26, 2024

(87) PCT Pub. No.: WO2023/006715
PCT Pub. Date: Feb. 2, 2023

(65) Prior Publication Data
US 2025/0079826 A1 Mar. 6, 2025

(30) Foreign Application Priority Data
Jul. 27, 2021 (DE) .................. 10 2021 003 830.4

(51) Int. Cl.
*H02H 3/26* (2006.01)
(52) U.S. Cl.
CPC ................... *H02H 3/26* (2013.01)
(58) Field of Classification Search
CPC ..................................................... H02H 3/26
See application file for complete search history.

(56) References Cited

U.S. PATENT DOCUMENTS

| 5,594,321 A | 1/1997 | Kohl et al. |
| 11,280,848 B2 * | 3/2022 | Mayer ............... G01R 31/52 |

(Continued)

FOREIGN PATENT DOCUMENTS

| DE | 4327484 A1 | 2/1995 |
| DE | 102017009355 A1 | 4/2018 |

(Continued)

OTHER PUBLICATIONS

International Search Report and Written Opinion mailed Nov. 18, 2022 in related/corresponding International Application No. PCT/EP2022/070890.

(Continued)

*Primary Examiner* — Scott Bauer
(74) *Attorney, Agent, or Firm* — PATENT PORTFOLIO BUILDERS PLLC

(57) ABSTRACT

A safety device for a DC grid includes a voltage measuring device between a potential line and a reference potential line, and a protective circuit for reducing an electric shock caused by Y-capacitors of the electric DC grid. The protective circuit includes a circuit breaker between the respective potential line and the reference potential line. A plurality of tripping criteria are predefined and the first circuit breaker and/or the second circuit breaker can be actuated so as to close exclusively in the event of all predefined tripping criteria being met as determined by the first voltage measuring device and/or by the second voltage measuring device.

7 Claims, 6 Drawing Sheets

(56) References Cited

U.S. PATENT DOCUMENTS

Figure 1:
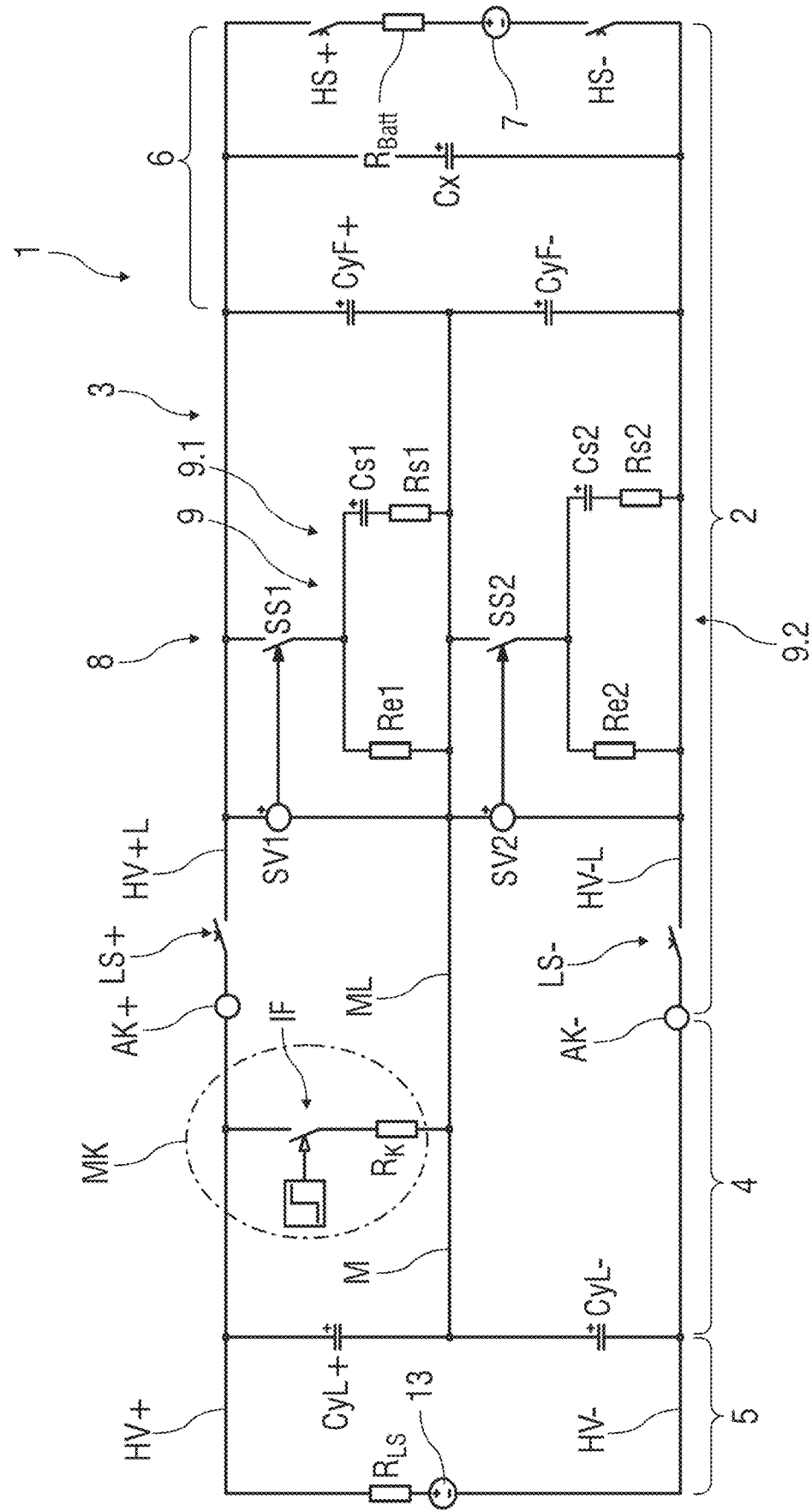

| | | | | |
|---|---|---|---|---|
| 2011/0006726 A1* | 1/2011 | Dittmer | ............... | B60L 3/0046 |
| | | | | 320/101 |
| 2011/0222192 A1* | 9/2011 | Fukuda | ............... | H02M 5/293 |
| | | | | 361/18 |
| 2013/0257446 A1* | 10/2013 | Soell | ............... | B60L 50/72 |
| | | | | 324/503 |
| 2015/0185272 A1* | 7/2015 | Oberzaucher | ......... | G01R 27/18 |
| | | | | 324/761.01 |
| 2022/0399847 A1* | 12/2022 | Wacker | ............... | H02P 29/032 |
| 2024/0025259 A1* | 1/2024 | Heimann | ............. | H02M 1/322 |

FOREIGN PATENT DOCUMENTS

| | | | |
|---|---|---|---|
| DE | 102018211625 A1 | 1/2020 |
| DE | 102019202892 A1 | 9/2020 |
| DE | 102019008833 A1 | 6/2021 |

OTHER PUBLICATIONS

Office Action created Mar. 10, 2022 in related/corresponding DE Application No. 10 2021 003 830.4.

* cited by examiner

SAFETY DEVICE FOR AN ELECTRIC DC GRID, ONBOARD ELECTRICAL SYSTEM FOR A VEHICLE, VEHICLE, AND DC CHARGING STATION

BACKGROUND AND SUMMARY OF THE INVENTION

Exemplary embodiments invention relate to a safety device for an electric DC grid, an onboard electrical system for a vehicle, a vehicle, and a DC charging station.

From the prior art, the generic document DE 10 2019 202 892 A1 describes an onboard electrical system arrangement for a motor vehicle, wherein the onboard electrical system arrangement has a high-voltage energy storage device for providing a first high-voltage potential and a second high-voltage potential. A total voltage can be tapped between the first and the second high-voltage potentials, wherein a first insulation resistance exists between the first high-voltage potential and a predetermined electrical earth and a second insulation resistance exists between the second high-voltage potential and the predetermined electrical earth. An insulation monitor monitors the first and second insulation resistance and has an equalizing circuit designed to carry out an active balancing process, so that the active balancing process at least reduces a difference between the first insulation resistance and the second insulation resistance.

DE 10 2018 211 625 A1 also discloses an onboard electrical system arrangement for a motor vehicle comprising a high-voltage energy storage device for providing a first and a second high-voltage potential between which a total voltage can be tapped. The onboard electrical system arrangement is designed symmetrically such that a first insulation resistance, between the first high-voltage potential and earth, differs from a second insulation resistance, between the second high-voltage potential and earth, by a maximum of a predeterminable amount. For this purpose, the onboard electrical system arrangement has a symmetry monitor that monitors the onboard electrical system symmetry and, if the first insulation resistance differs from the second insulation resistance by more than the predeterminable amount, to initiate a predetermined measure.

Similarly, as described in DE 10 2017 009 355 A1, a method for operating electric onboard electrical systems is also known from the prior art. In the method for operating a first onboard electrical system to which a first electric DC voltage is applied and a second onboard electrical system to which a second electric DC voltage is applied, the first and the second onboard electrical systems are electrically coupled by means of a first energy coupler having a clocked energy converter. The first and the second DC voltages are electrically insulated from an electrical reference potential by means of an electrical insulation device. The electrical insulation device is monitored. The first and the second onboard electrical systems are galvanically coupled by means of the energy coupler. If the insulation device is faulty in an area of one of the two onboard electrical systems, the energy coupler controls electrical potentials of the other of the two onboard electrical systems respectively such that any potential differences of these electrical potentials from the reference potential are less than a predefined comparative value.

DE 10 2019 008 833 describes a safety device for an electric DC grid, in particular for a high-voltage network, an onboard electrical system for a vehicle, a vehicle, and a DC charging station. The safety device comprises either a first voltage measuring device between a positive potential line and a reference potential line for measuring a voltage between the positive potential line and the reference potential line and a second voltage measuring device between a negative potential line and the reference potential line for measuring a voltage between the negative potential line and the reference potential line, or a residual current measuring device in the reference potential line. The safety device additionally comprises a protective circuit, either with an electric series circuit consisting of a discharge resistor and a first circuit breaker between the positive potential line and the reference potential line and an electric series circuit consisting of the discharge resistor and a second circuit breaker between the negative potential line and the reference potential line, or with two protective circuit parts, wherein the first protective circuit part comprises an electric series circuit consisting of a first discharge resistor and a first circuit breaker between the positive potential line and the reference potential line and the second protective circuit part comprises an electric series circuit consisting of a second discharge resistor and a second circuit breaker between the negative potential line and the reference potential line. The first circuit breaker can be actuated to close if the first and/or second voltage measuring device determines that a predefined voltage value has been undershot and the second circuit breaker can be actuated to close if the second and/or first voltage measuring device determines that the predefined voltage value has been undershot. Alternatively, the first circuit breaker and/or the second circuit breaker can be actuated to close if the residual current measuring device measures a residual current.

Exemplary embodiments of the invention are directed to a safety device for an electric DC grid that is improved in respect of the prior art, an onboard electrical system for a vehicle that is improved in respect of the prior art, a vehicle comprising such an onboard electrical system that is improved in respect of the prior art and a DC charging station that is improved in respect of the prior art.

A safety device according to the invention for an electric DC grid, in particular for a high-voltage network, for example for an onboard electrical system of a vehicle, comprises a first voltage measuring device between a positive potential line and a reference potential line for measuring a voltage between the positive potential line and the reference potential line and a second voltage measuring device between a negative potential line and the reference potential line for measuring a voltage between the negative potential line and the reference potential line. The reference potential is in particular an electrical earth potential, when the safety device is used in a vehicle, in particular a vehicle earth potential, when the safety device is used in a DC charging station, for example an earth potential.

In addition, the safety device comprises a protective circuit to reduce the risk of an electric shock, in particular to a person, i.e., a human body, caused by Y-capacitors of the electric DC grid.

The protective circuit comprises a first circuit breaker between the positive potential line and the reference potential line and a second circuit breaker between the negative potential line and the reference potential line. A plurality of tripping criteria are predefined, wherein the first circuit breaker and/or the second circuit breaker can be actuated so as to close exclusively in the event of all predefined tripping criteria being met as determined by means of the first voltage measuring device and/or by means of the second voltage measuring device. The tripping criteria relate, in particular, to fault causes/interferences that may occur and the occurrence of which is intended to prevent the circuit breaker from closing. Advantageously, at least one tripping criterion is predefined for each of these fault causes/interferences in such a way that it is met in the event of physical contact, i.e. when a person, i.e., a human body, comes into contact with one of the high-voltage potentials, and is not met when the respective fault cause occurs. Tripping, i.e., closing the respective circuit breaker, is only effected if all of the predefined tripping criteria come into effect, i.e., are met. This ensures that the respective circuit breaker is only closed in the event of physical contact, i.e., when a person, i.e., a human body, comes into contact with one of the high-voltage potentials and that erroneous closing due to the occurrence of one or a plurality of the fault causes/interferences is reliably avoided.

An electric onboard electrical system according to the invention, in particular a high-voltage onboard electrical system, for a vehicle, in particular for an electric vehicle or a hybrid vehicle, comprises such a safety device.

A vehicle according to the invention, in particular an electric vehicle or a hybrid vehicle, comprises such a safety device, in particular such an onboard electrical system, in particular a high-voltage onboard electrical system, with such a safety device.

A DC charging station according to the invention, in particular a DC charging station outside the vehicle, in particular a high-voltage DC charging station, in particular for the electrical charging of a vehicle, in particular of an electric vehicle or a hybrid vehicle, in particular of a high-voltage battery of a such a vehicle, comprises such a safety device.

The term "high-voltage" is understood to mean, in particular, an electric DC voltage which, in particular, is greater than about 60 V. In particular, the term "high-voltage" is to be interpreted in accordance with standard ECE R 100.

The solution according to the invention advantageously ensures that not only does the protective circuit trip very quickly in order to minimize the charge and energy converted in the body resistance, but also that erroneous tripping is kept to a minimum or is advantageously avoided. Erroneous tripping would lead to an insulation fault for a very short period of time. In addition, the protective circuit causes a massive shift in the high-voltage potentials, which represents a maximum deviation from the lowest amount of energy stored in the Y-capacitors. In addition, the functioning of an insulation monitor can be impaired if the protective circuit is erroneously tripped repeatedly. By way of example, sources of interference in the vehicle and/or in the DC charging station can cause the protective circuit to trip incorrectly. This is avoided or at least significantly reduced by the solution according to the invention.

The solution according to the invention makes the evaluation of the protective circuit more stable to erroneous tripping since a plurality of tripping criteria have to be met simultaneously. In particular, the individual tripping criteria are evaluated with an AND logic operation. The individual tripping criteria depend on the type of fault. The type of fault is compared with the characteristics of a discharge of the Y-capacitors through a body resistance. Advantageously, at least one feature that can be detected by a measurement or evaluation is found to distinguish each fault from such a CY body resistance discharge. In each case, at least this one feature per fault must differ from the property of the CY body current discharge. Examples include the distinction between common mode and differential mode events, minimum recharging voltages, time constants of a capacitor recharging (time constants of the exponential function), frequencies/frequency spectra or repetition rates of a clocked interference, etc. The voltage measurement by means of the voltage measuring devices is used as an input variable, i.e., between the positive potential line and the reference potential line and between the negative potential line and the reference potential line.

By linking the tripping of the protective circuit to various characteristic features of a CY body discharge, instances of erroneous tripping can be minimized or avoided completely. At the same time, a very fast tripping time is achieved, thus minimizing the energy/charge converted in the human body.

The voltages measured by means of the voltage measuring are evaluated in particular as follows:
  determining deviations of presently applied voltages dU from positive potential line to reference potential line and from negative potential line to reference potential line in relation to a previously determined voltage value, and/or
  determining voltage changes dU/dt, i.e., over time, of the voltages from positive potential line to reference potential line and from negative potential line to reference potential line, and/or
  considering the opposite sign, in particular in the case of the above two determinations, with respect to the evaluation of the voltages from positive potential line to reference potential line and from negative potential line to reference potential line, and/or
  considering a cyclical repetition of any fault that occurs.

The tripping criteria thus comprise:
  the voltage deviation of the voltage currently applied between the positive potential line and the reference potential line and the voltage applied between the negative potential line and the reference potential line from a previously determined voltage value, and/or
  the voltage changes over time in the voltage applied between the positive potential line and the reference potential line and the voltage applied between the negative potential line and the reference potential line, and/or
  the voltage applied between the positive potential line and the reference potential line and is of the opposite sign to the voltage applied between the negative potential line and the reference potential line, and/or
  the absence of a cyclical repetition of the other tripping criteria.

The first circuit breaker and/or the second circuit breaker can then only be actuated, if
  the voltage currently applied between the positive potential line and the reference potential line and the voltage applied between the negative potential line and the reference potential line deviates from the previously determined voltage value by more than a predefined limit value, in one possible embodiment a limit value of 30 V, and
  the voltage changes over time of the voltage applied between the positive potential line and the reference potential line and the voltage applied between the negative potential line and the reference potential line exceed a predefined limit value, and
  the voltage applied between the positive potential line and the reference potential line is of the opposite sign to the voltage applied between the negative potential line and the reference potential line.

The limit values depend, in particular, on the time constant $t=R*C$ to be observed. Here, R is R the human body resistance, which is assumed to be the lowest value according to standard specifications up to 500 ohms. By way of example, body resistances in the range from 300 ohms to 30 kiloohms are taken into account. C depends on the total capacitance of the Y-capacitors located in the high-voltage system, i.e., in the high-voltage DC system. By way of example, this depends on the vehicle situation, for example whether only the vehicle is considered, for example during driving, or the vehicle in conjunction with a DC charging station. By way of example, for C a range of 200 nF (in particular vehicle only, in particular optimized for low capacitances of the Y-capacitors) up to a value of approx. 8 µF (DC charging station and vehicle) in the case of megawatt charging, i.e., DC charging with high power. All capacitance values relate to each high-voltage potential, i.e., double the value is to be assumed as total capacitance. The protective circuit is required, in particular, to be active at voltages above 60 V. As a distinction, for example, the insulation monitor is considered for low frequencies (approx. 800 kiloohms test resistance, cycle time approx. 10 s) and an inverter with a clock frequency of at least 2 kHz is considered for frequencies above the tripping time constant.

According to the invention, the first circuit breaker and/or the second circuit breaker can only be actuated if the absence of a cyclical repetition of the other tripping criteria is also determined.

By way of example, an analog and/or digital evaluation of the voltage determined by means of the first voltage measuring device and/or by means of the second voltage measuring device is provided.

By way of example, in the analog evaluation with one output of the voltage measurement (e.g., high-impedance resistance divider), two evaluations are connected for each high-voltage potential via operational amplifier circuits. The operational amplifier circuits have two different time constants. The operational amplifier circuit of the first time constant (low frequency, below a time constant of a discharge via a human body resistance) is used to determine the voltage deviation from the previously determined voltage value. The operational amplifier circuit of the second time constant (higher frequency, above the time constant of the discharge via a human body resistance) is used to determine the voltage change over time. These two tripping criteria are linked in a logic AND operation and a logic AND operation is also performed with the negated result of the evaluation of the respective other high-voltage potential in order to determine whether the two voltages have opposite signs. If the overall result is "true", the protective circuit is actuated.

In the digital evaluation, the measured voltages are detected, for example, by a microcontroller, an ASIC (application-specific integrated circuit), or FPGA (field programmable gate array, i.e., an integrated circuit in digital technology, into which a logic circuit can be loaded). Software is used to filter and determine the voltage deviation from the previously determined voltage value and the voltage change over time for each high-voltage potential and then to perform the AND operations already described for the analogue evaluation. If the overall result is "true", the protective circuit is actuated.

By way of example, the analogue and digital evaluation are implemented at the same time, in particular as a redundancy measure.

The solution described has the effect that contact with a high-voltage potential by a human body is detected, and the protective circuit is activated, as quickly as possible. The quick activation is caused by the relatively fast discharge/recharging process of the Y-capacitors when the human body comes into contact with a high-voltage potential (order of magnitude approx. 10 ms). In this case, most of the energy converted in the body or the charge flowing through the body occurs at the beginning of the discharge/recharging process. It attenuates on an exponential function. This also makes it necessary to trip the protective circuit as quickly as possible.

However, it is also necessary that erroneous tripping due to other influential factors is ruled out or at least only occurs rarely. An erroneously tripped protective circuit leads to a potential distribution from the respective high-voltage potential to the reference potential that is very unfavorable in terms of energy, whereby the amount of energy stored in the Y-capacitors comes close to its maximum value, for example positive potential to reference potential approximately 0 V and reference potential to negative potential approximately close to a system voltage of the high-voltage system, for example 800 V. In addition, an insulation fault is generated for the moment the protective circuit is activated if the protective circuit is erroneously tripped. On activation by means of a capacitance of the protective circuit, an additional capacitance is also connected in parallel to the Y-capacitors, which in principle offers the possibility of storing more energy in the now increased total Y capacitance.

Since the protective circuit must detect the discharge through the human body resistance as quickly as possible, it is necessary to design it to react quickly. This also makes it sensitive to other interference. The solution described avoids or at least significantly reduces instances of erroneous tripping which could be caused by this increased sensitivity. As described above, ways of differentiating between interference and contact with a human body resistance include, for example, comparing the sign of the two measured voltages, whereby a distinction between common mode interference and differential mode interference is made possible, filters for distinguishing interference frequencies, averaging or change in voltage compared to a mean value over a defined period of time, in particular for distinguishing small energetic influences, a maximum voltage swing of the recharging processes, and/or sampling processes in accordance with predefined repetition rates, for example to detect regularly pulsating sources of interference, for example inverters.

If one considers the recharging process of the Y-capacitors when touched by a human body, this corresponds to a common-mode interference or a triggering of common-mode currents. This is advantageously differentiated from the following influences:

Common-mode interference of a clocked/pulsed high-voltage component would result in a common current contribution via the reference potential, just as in the case of a body discharge. The frequency range can be widely dispersed due to the multiplicity of clocking high-voltage components in the vehicle, the different clock frequencies thereof and possibly even variable clock frequencies, for example in the case of an onboard charger with an isolating LLC DC/DC converter.

In addition to the above-described common-mode interference, clocking high-voltage consumers also cause differential-mode interference. These can also influence the evaluation circuit with their interference level. An insulation monitor also causes the same recharging behavior as a body discharge of the Y-capacitors. In the case of the two known insulation monitor principles, the insulation monitor using the recharging resistance is particularly critical here.

The following table compares the CY body discharge with the above-described interference influences in respect of the frequency spectrum, the voltage swing, the type of interference (CM or DM) and the repetition rate.

| Type of fault/ interference | Frequency range (interference) spectrum | Voltage swing | EMC interference (Common Mode (CM) or Differential Mode (DM)) | repetition rate |
| --- | --- | --- | --- | --- |
| CY body discharge | T = CY*R_body, approx. 2 kHz | Full recharging | CM | One-time or slowly recurring |
| Clocking consumer: inverter, clocking interference | 0 Hz-1 MHz | <25 V | CM and DM | >10 kHz |
| Clocking consumer: inverter, fundamental wave | 0 Hz-1 MHz | <25 V | CM and DM | 0-2 kHz |
| Clocking consumer: DC/DC converter | 0 Hz-100 MHz | <25 V | CM and DM | >50 kHz |
| Clocking consumer: heater | 0 Hz-1 MHz | <25 V | CM and DM | approx. 50 Hz |
| Clocking consumer: electric refrigeration compressor | 0 Hz-100 MHz | <25 V | CM and DM | approx. 10 kHz |
| Insulation monitor | T = CY * 1 MOhm, approx. 1 Hz | Full recharging | CM | <1 Hz, recurring |
| Ripple current (DC charging) | approx. 5-100 kHz | 100 A*100 mOhm = 10 V | CM and DM | >100 kHz |

The solution taken to avoid erroneously tripping the protective circuit lies in particular in linking a plurality of features together.

By way of example, a bandpass filter can be provided for the voltage measurement, which can be realized using hardware or software, for example. This makes it possible to distinguish common-mode interference caused by human body resistance from interference caused by an insulation monitor, in particular downwards, and from common-mode interference caused by clocking components, in particular upwards. As a result, an interaction of the protective circuit with the insulation monitor, high-voltage consumers, and a charging station (EVSE) is reduced.

By way of example, a logic operation of the voltage tripping for positive potential and negative potential is provided. This makes it possible to reliably distinguish between common-mode interference and differential-mode interference, so that subsequently only common-mode interference needs to be considered. As a result, an interaction of the protective circuit clocked consumers is reduced.

By way of example, a minimum recharging swing, for example 50 V, is taken into account, i.e., the protective circuit is not tripped until then. This means that minor interference is ignored. As a result, an interaction of the protective circuit with clocked consumers is reduced.

By way of example, a moving average, i.e., a mean value of the voltage over a predefined period of time, is taken into account, and the protective circuit is not tripped until this value is reached. Very low-impedance and regular interference is therefore assessed as weaker. As a result, an interaction of the protective circuit with clocked consumers is reduced.

In one possible embodiment, a common voltage evaluation unit coupled to the voltage measuring devices and to the circuit breakers is provided for evaluating the voltage determined by the first voltage measuring device and the voltage determined by the second voltage measuring device and for actuating the first circuit breaker and/or the second circuit breaker exclusively in the event of all predefined tripping criteria being met as determined by means of the first voltage measuring device and/or by means of the second voltage measuring device.

The respective circuit breaker is, for example, a semiconductor switch, for example a MOSFET, IGBT or thyristor.

In one possible embodiment, the protective circuit comprises, for example, an electric series circuit consisting of a discharge resistor and of the first circuit breaker between the positive potential line and the reference potential line and an electric series circuit consisting of the discharge resistor and of the second circuit breaker between the negative potential line and the reference potential line. Alternatively, the protective circuit comprises, for example, two protective circuit parts, wherein the first protective circuit part comprises an electric series circuit consisting of a first discharge resistor and of the first circuit breaker between the positive potential line and the reference potential line and the second protective circuit part comprises an electric series circuit consisting of a second discharge resistor and of the second circuit breaker between the negative potential line and the reference potential line.

The described solution solves the problems associated with Y-capacitors in vehicles, in particular in electric vehicles and hybrid vehicles, and in DC charging stations, as explained below. Such Y-capacitors are used as measures to reduce the emission of EMC interference (EMC=electromagnetic compatibility). However, they represent an increased potential risk in terms of their high-voltage safety. For example, the standards SAE J1772, IEC60479-1 and -2 specify a charge quantity contained in the Y-capacitors as a feature that is a health risk (C1 characteristic curve). As the operating voltage of the vehicle increases, it becomes more and more difficult to keep within the limit values required under these standards. In some cases as well, alternative measures for meeting safety regulations, such as greater, in particular double, electric insulation, are not permitted. The further standard LV123 and standards associated therewith prescribe, for example, a maximum energy content of 0.2 J for the charge quantity of all Y-capacitors. If the alternative measures are permitted as a way forward, then, for example, the already mentioned greater, in particular double, electric insulation can be used. However, this can only be implemented if all high-voltage systems that are coupled to one another have correspondingly greater insulation. In other words, for example, during DC charging, both the vehicle and the DC charging station, in particular the charging column, would have to have correspondingly greater insulation. However, since there is no compulsory standard for this, couplings of systems with different insulation designs would also be possible, meaning that the safety requirements would not be met.

This problem is solved by the circuit described because, through a voltage measurement of each high-voltage potential compared to the reference potential, in particular the earth potential, a shift of the high-voltage potentials with respect to the reference potential is detected, this possibly being the consequence of a body current, in other words the consequence of physical, in particular human, contact with one of the high-voltage potentials and with the reference potential. In order to reduce the voltage as rapidly as possible in the high-voltage potential concerned, in which the voltage is reduced compared to the reference potential, the discharge resistor and, advantageously electrically parallel thereto, an uncharged protective capacitor are connected. The voltage between the high-voltage potential concerned compared to the reference potential thereby suddenly jumps to a much lower level, as a result of which the body current reduces proportionally to the voltage. The described solution therefore makes it possible to reduce an electric shock caused to the body, in particular the human body, by the Y-capacitors. The requirements described above can therefore be met. It is also possible to limit the electrical energy of the Y-capacitors converted by the body resistance to an amount below 0.2 J, even though the energy stored in the Y-capacitors may be significantly higher.

As already mentioned above, a protective capacitor is advantageously electrically connected in parallel to the discharge resistor. The discharge resistor on its own would have to be of very low impedance in order to reduce the body current rapidly. However, the disadvantage is that this creates a low-impedance insulation fault. As a result, the combination of discharge resistor and protective capacitor electrically connected in parallel is much more advantageous. The discharge resistor ensures that the protective capacitor electrically connected in parallel was voltage-free at the moment of activation. After activation, it ensures rapid discharging of the Y-capacitors of the high-voltage potential concerned.

The protective circuit therefore comprises, for example, the electric series circuit consisting of the discharge resistor and the first circuit breaker between the positive potential line and the reference potential line and the electric series circuit consisting of the discharge resistor and the second circuit breaker between the negative potential line and the reference potential line, wherein the protective capacitor is electrically connected in parallel to the discharge resistor. Alternatively, the protective circuit comprises both protective circuit parts, wherein the first protective circuit part comprises the electric series circuit consisting of the first discharge resistor and the first circuit breaker between the positive potential line and the reference potential line, wherein a first protective capacitor is electrically connected in parallel to the first discharge resistor, and wherein the second protective circuit part comprises the electric series circuit consisting of the second discharge resistor and the second circuit breaker between the negative potential line and the reference potential line, wherein a second protective capacitor is electrically connected in parallel to the second discharge resistor.

For example, the protective capacitor is not only electrically connected in parallel to the discharge resistor, but an electric series circuit consisting of the protective capacitor and a protective resistor is electrically connected in parallel. The protective resistor is advantageously used to limit a current over the protective capacitor.

The protective circuit therefore comprises, for example, the electric series circuit consisting of the discharge resistor and the first circuit breaker between the positive potential line and the reference potential line and the electric series circuit consisting of the discharge resistor and the second circuit breaker between the negative potential line and the reference potential line, wherein the electric series circuit consisting of the protective capacitor and the protective resistor is electrically connected in parallel to the discharge resistor. Alternatively, the protective circuit comprises both protective circuit parts, wherein the first protective circuit part comprises the electric series circuit consisting of the first discharge resistor and the first circuit breaker between the positive potential line and the reference potential line, wherein an electric series circuit consisting of the first protective capacitor and a first protective resistor is electrically connected in parallel to the first discharge resistor, and wherein the second protective circuit part comprises the electric series circuit consisting of the second discharge resistor and the second circuit breaker between the negative potential line and the reference potential line, wherein an electric series circuit consisting of the second protective capacitor and a second protective resistor is electrically connected in parallel to the second discharge resistor.

In a further embodiment, the protective circuit comprises an electric series circuit consisting of an electric resistor and a first circuit breaker between the positive potential line and the reference potential line and an electric series circuit consisting of the electric resistor and a second circuit breaker between the negative potential line and the reference potential line. The electric resistor is, in particular, an electric resistor with a fixed resistance value of at most 800Ω, in particular at most 600Ω, in particular less than, in particular significantly less than, a human body resistance, i.e., than a body resistance of a person, in particular at most 200Ω, in particular at most or less than 50Ω, for example less than 5Ω. This significantly reduces the current flowing through the human body. Alternatively, the electric resistor is, for example, a voltage-dependent electric resistor, which is designed in such a way that a resistance value of the voltage-dependent electric resistor is reduced, in particular increasingly reduced, as the electric voltage across connections of the voltage-dependent electric resistor increases, wherein a maximum resistance value of the voltage-dependent electric resistor is, for example, at most 800Ω, in particular at most 600Ω, in particular less than, in particular significantly less than, a human body resistance, i.e. than a body resistance of a person, in particular at most 200 Ω is, in particular at most or less than 50Ω, for example less than 5Ω. This is therefore true of all resistance values that the voltage-dependent electric resistor can have at the electric voltages occurring across its connections. This significantly reduces the current flowing through the human body. The voltage-dependent electric resistor is thus designed in such a way that its resistance value assumes smaller resistance values as the voltage across its connections increases.

This embodiment of the protective circuit is a component-optimized protective circuit. In the case of the protective circuit, which serves to reduce a CY shock, i.e., an electric shock to a person through Y-capacitors, it can be assumed that only one potential, i.e., a positive potential or a negative potential, is connected to a housing earth via a body resistance of the person. If both potentials were connected to the housing earth, this would be equivalent to a short circuit of a vehicle battery when using the safety device in the vehicle, or a short circuit of a DC charging station, for example charging column, when using the safety device in the DC charging station, which short circuit would have to be disconnected by a fuse or a current sensor with a cut-off device controlled by the latter. It is therefore evident that the protective circuit for the positive potential and the negative potential is never used at the same time. Thus, the electric resistor can be used in the manner described to provide both potentials with short-circuit protection.

Alternatively, the protective circuit comprises two protective circuit parts, wherein the first protective circuit part comprises an electric series circuit consisting of a first electric resistor and a first circuit breaker between the positive potential line and the reference potential line and the second protective circuit part comprises an electric series circuit consisting of a second electric resistor and a second circuit breaker between the negative potential line and the reference potential line. The respective electric resistor is an electric resistor with the above-specified fixed resistance value. This significantly reduces the current flowing through the human body. Alternatively, the respective electric resistor is a voltage-dependent electric resistor that is designed in such a way that a resistance value of the voltage-dependent electric resistor is reduced, in particular increasingly reduced, as the electric voltage across connections of the voltage-dependent electric resistor increases, wherein a maximum resistance value of the voltage-dependent electric resistor corresponds to the above-specified values for the maximum resistance value. This is therefore true of all resistance values that the voltage-dependent electric resistor can have at the electric voltages occurring across its connections. This significantly reduces the current flowing through the human body. The voltage-dependent electric resistor is thus designed in such a way that its resistance value assumes smaller resistance values as the voltage across its connections increases.

In the above-described embodiment of the protective circuit, which comprises just the one electric resistor, i.e., uses the same electric resistor for the electric series circuit with the first circuit breaker between the positive potential line and the reference potential line and with the second circuit breaker between the negative potential line and the reference potential line, it is provided in particular that only one of the two circuit breakers can be or is actuated for closing, and not both circuit breakers, in particular not simultaneously.

The described solution solves the problems associated with Y-capacitors in vehicles, in particular in electric vehicles and hybrid vehicles, and in DC charging stations, as explained below. Such Y-capacitors are used as a means of reducing the emission of EMC interference (EMC=electromagnetic compatibility). However, they represent an increased potential risk in terms of their high-voltage safety. In various standards, the charge quantity contained or the energy stored in the Y-capacitors is cited as feature that is a health risk. For example, the standards SAE J1772, IEC60479-1 and -2 specify a charge quantity contained in the Y-capacitors as a feature that is a health risk (C1 characteristic curve). As the operating voltage of the vehicle increases, it becomes more and more difficult to keep within the limit values required under these standards. In some cases, alternative measures for meeting safety regulations, such as greater, in particular double, electric insulation, are not permitted. The further standard LV123 and standards associated with it prescribe, for example, a maximum energy content of 0.2 J for the charge quantity of all Y-capacitors. If the alternative measures are permitted as a way forward, then, for example, the already mentioned greater, in particular double, electric insulation could be used. However, this could only be implemented if all high-voltage systems which are coupled to one another have correspondingly greater insulation. In other words, for example, during DC charging, both the vehicle and the DC charging station, in particular the charging column, would have to have correspondingly greater insulation. However, since there is no compulsory standard for this, couplings of systems with different insulation designs would also be possible, meaning that the safety requirements would not be met.

This problem is solved by the circuit described because, through a voltage measurement of each high-voltage potential compared to the reference potential, in particular the earth potential, a shift of the high-voltage potentials with respect to the reference potential is detected, this possibly being the consequence of a body current, in other words the consequence of physical, in particular human, contact with one of the high-voltage potentials and with the reference potential. In order to reduce the voltage as rapidly as possible in the high-voltage potential concerned, in which the voltage is reduced compared to the reference potential, the resistor is connected. The voltage between the high-voltage potential concerned compared to the reference potential thereby suddenly jumps to a much lower level, as a result of which the body current reduces proportionally to the voltage. The solution described therefore makes it possible to reduce an electric shock caused to the body, in particular the human body, by the Y-capacitors. The requirements described above can therefore be met. It is also possible to limit the electrical energy of the Y-capacitors converted through body resistance to an amount below 0.2 J, even though the energy stored in the Y-capacitors may be significantly higher.

The advantage of the protective circuit of the safety device with the electric series circuit consisting of the resistor or of the first and second resistors with the respective circuit breaker between the respective potential line and the reference potential line, compared to a parallel circuit connected electrically in series with the respective circuit breaker and consisting of a capacitor connected in series with a protective resistor and of a discharge resistor, is that the protective circuit of the described solution does not require any such discharge resistor. As a result, when lower voltages are reached between the positive potential and the reference potential or between the negative potential and reference potential, the system automatically returns to a state with higher isolation resistances, even though the first and/or the second circuit breaker are still closed. In the protective circuit with the parallel circuit consisting of the capacitor connected in series with the protective resistor and of the discharge resistor, which parallel circuit is electrically connected in series with the respective circuit breaker, the protective resistor would reduce the overall insulation value of a high-voltage system, in particular the DC grid, for example the onboard electrical system of the vehicle, to a lower value if the first or second circuit breaker is closed. This is avoided by the solution described.

The protective circuit of the described solution can moreover provide an equivalent discharge path to the body current each time a high-voltage potential, i.e., the positive potential or the negative potential, is touched in quick succession. In contrast, the protective circuit with the parallel circuit consisting of the capacitor connected in series with the protective resistor and of the discharge resistor, which parallel circuit is electrically connected in series with the respective circuit breaker, either requires waiting until the protective capacitor has been discharged to a very low voltage value via the discharge resistor, or this protective circuit represents a decreasing protective effect in the event of physical contact with a high-voltage potential multiple times in quick succession, because the protective capacitor still has a residual voltage and can no longer store as much energy.

It is therefore advantageously provided that the safety device described here, in particular the protective circuit thereof, is designed in such a way that it is able to be activated independently, i.e., to close the first and/or second circuit breaker, and to open the respective closed circuit breaker again after a short dwell time in this activated state. Communication within the vehicle to a superordinate control unit, which carries out measures such as opening contactors, in particular charging contactors and/or main contactors, and discharging the Y-capacitors, is advantageously dispensed with here. The detection of a permanently applied insulation fault, i.e., a low insulation resistance and not, for example, a defective protective sheath of a high-voltage cable, is advantageously detected by another device, for example by an insulation monitor and/or by a measurement of a high-voltage potential distribution, which is not part of the safety device described here and its protective circuit and is also not connected with this. As mentioned, the safety device described here and its protective circuit are able to trip repeatedly at very short intervals and thus also in the event of rapidly recurring contact by a person, thus ensuring protection for the person. Accidental tripping, for example due to EMC interference, does not lead to further measures in the vehicle, such as an erroneous switch-off of the high-voltage system. The independent functioning of the safety device, in particular of its protective circuit, means that it can be flexibly and easily integrated into an existing high-voltage system. The independent functioning moreover reduces the safety requirements placed on the safety device and its protective circuit, for example the need for a secure functioning/communication with another control device is eliminated.

In contrast to the protective circuit with the parallel circuit connected electrically in series with the respective circuit breaker and consisting of the capacitor connected in series with the protective resistor and of the discharge resistor, the solution described here does not lead to an increase in the total capacitance between the positive potential and reference potential and between the negative potential and reference potential.

By comparing the solution described here with the protective circuit with parallel circuit connected electrically in series with the respective circuit breaker and consisting of the capacitor connected in series with the protective resistor and of the discharge resistor, it can be seen that at the moment of activating the protective circuit, the uncharged capacitor has a lower impedance, whereby the body current can be reduced more quickly. The transferred charge and the energy converted in the human body are therefore initially somewhat lower. As time goes on, however, the capacitor is charged and its impedance thus increases. However, the electrical resistor of the solution described here, which is designed as a voltage-dependent resistor in the form of a varistor, remains almost constant until its varistor voltage reaches 80 V, for example, and can therefore reduce the body current more quickly over time.

In one possible embodiment, the voltage-dependent electric resistor and thus, in the above-specified embodiment with just the one electric resistor, this one electric resistor and, in the above-specified alternative embodiment with the two protective circuit parts and the first and second electric resistors, the first electric resistor and/or the second electric resistor is designed as a varistor or as a series circuit and/or parallel circuit consisting of a plurality of varistors, for example with and/or without additional circuitry. The additional circuitry is, in particular, a series resistor to limit the varistor current.

In one possible embodiment, the electric resistor and/or the first electric resistor and/or the second electric resistor is electrically connected in series with an electric protective resistor. In other words, in the above-specified embodiment with just the one electric resistor, this electric resistor is electrically connected in series with an electric protective resistor. The electrical series connection of the electric resistor and electric protective resistor forms, in this case, a common discharge network between the positive potential and the reference potential and between the negative potential and the reference potential. In the above-specified alternative embodiment with the two protective circuit parts and the first and second electric resistors, the first electric resistor is electrically connected in series with an electric protective resistor and/or the second electric resistor is electrically connected in series with an electric protective resistor. The electrical series connection of the respective electric resistor and the respective electric protective resistor forms, in this case, a discharge network between the positive potential and the reference potential and a discharge network between the negative potential and the reference potential. The electric protective resistor or the respective electric protective resistor is used to prevent the respective circuit breaker from being destroyed by too high a current. The electric protective resistor or the respective electric protective resistor can, for example, be dispensed with if the electric resistor or the respective electric resistor, in particular in its embodiment as a voltage-dependent electric resistor, always ensures that a maximum current flow is limited in such a way that it cannot lead to the respective circuit breaker being destroyed.

The above-mentioned human body resistance, i.e., body resistance of a person, is assumed to be a resistance value of 500Ω, in particular according to specifications in the applicable standards.

In a further embodiment, the protective circuit comprises an electric series circuit consisting of an electric protective capacitor, an electric protective resistor and the first circuit breaker between the positive potential line and the reference potential line and an electric series circuit consisting of the electric protective capacitor, the electric protective resistor and the second circuit breaker between the negative potential line and the reference potential line, wherein an electric discharge resistor is connected electrically in parallel with the protective capacitor and protective resistor and an electric series circuit consisting of an electric fast discharge resistor and a fast discharge switch is connected electrically in parallel with the protective capacitor or with the protective capacitor and protective resistor.

This embodiment of the protective circuit is a component-optimized protective circuit. In the case of the protective circuit, which serves to reduce a CY shock, i.e., an electric shock to a person through Y-capacitors, it can be assumed that only one potential, i.e., a positive potential or a negative potential, is connected to a housing earth via a body resistance of the person. If both potentials were connected to the housing earth, this would be equivalent to a short circuit of a vehicle battery when using the safety device in the vehicle, or a short circuit of a DC charging station, for example charging column, when using the safety device in the DC charging station, which short circuit must be disconnected by a fuse or a current sensor with a cut-off device controlled by the latter. It is therefore evident that the protective circuit for the positive potential and the negative potential is never used at the same time. Thus, this embodiment of the protective circuit can be used in the manner described to provide both potentials with short-circuit protection.

In a method for operating this embodiment of the safety device, the first circuit breaker or the second circuit breaker is closed in the event of the tripping criteria being met and opened again after the protective capacitor has been charged and then the fast discharge switch is closed and opened again after the protective capacitor has been discharged.

Advantageously, it is provided in this embodiment of the protective circuit that only one of the two respective circuit breakers can be or is actuated for closing, in particular depending on this, and not both circuit breakers, in particular not simultaneously.

In an alternative embodiment, the protective circuit comprises two protective circuit parts. The first protective circuit part comprises an electric series circuit consisting of a first electric protective capacitor, a first electric protective resistor, and the first circuit breaker between the positive potential line and the reference potential line, wherein a first electric discharge resistor is electrically connected in parallel with the first protective capacitor and first protective resistor and an electric series circuit consisting of a first electric fast discharge resistor and a first fast discharge switch is electrically connected in parallel with the first protective capacitor or with the first protective capacitor and first protective resistor. The second protective circuit part comprises an electric series circuit consisting of a second electric protective capacitor, a second electric protective resistor, and the second circuit breaker between the negative potential line and the reference potential line, wherein a second electric discharge resistor is electrically connected in parallel with the second protective capacitor and second protective resistor and an electric series circuit consisting of a second electric fast discharge resistor and a second fast discharge switch is electrically connected in parallel with the second protective capacitor or with the second protective capacitor and second protective resistor.

In the method for operating the safety device, in the event of the tripping criteria being met, the first circuit breaker is then closed accordingly and opened again after the first protective capacitor has been charged again and then the first fast discharge switch is closed and opened again after the first protective capacitor has been discharged, and/or in the event of the tripping criteria being met, the second circuit breaker is closed and opened again after the second protective capacitor has been charged and then the second fast discharge switch is closed and opened again after the second protective capacitor has been discharged.

The described solution solves the problems associated with Y-capacitors in vehicles, in particular in electric vehicles and hybrid vehicles, and in DC charging stations, as explained below. Such Y-capacitors are used as measures to reduce the emission of EMC interference (EMC=electromagnetic compatibility). However, they represent an increased potential risk in terms of their high-voltage safety. For example, the standards SAE J1772, IEC60479-1 and -2 specify a charge quantity contained in the Y-capacitors as a feature that is a health risk (C1 characteristic curve). As the operating voltage of the vehicle increases, it becomes more and more difficult to keep within the limit values required under these standards. In some cases as well, alternative measures for meeting safety regulations, such as greater, in particular double, electric insulation, are not permitted. The further standard LV123 and standards associated therewith prescribe, for example, a maximum energy content of 0.2 J for the charge quantity of all Y-capacitors. If the alternative measures are permitted as a way forward, then, for example, the already mentioned greater, in particular double, electric insulation can be used. However, this can only be implemented if all high-voltage systems which are coupled to one another have correspondingly greater insulation. In other words, for example, during DC charging, both the vehicle and the DC charging station, in particular the charging column, would have to have correspondingly greater insulation. However, since there is no compulsory standard for this, couplings of systems with different insulation designs would also be possible, meaning that the safety requirements would not be met.

This problem is solved by the circuit described because, through a voltage measurement of each high-voltage potential compared to the reference potential, in particular the earth potential, a shift of the high-voltage potentials with respect to the reference potential is detected, this possibly being the consequence of a body current, in other words the consequence of physical, in particular human, contact with one of the high-voltage potentials and with the reference potential. In order to reduce the voltage as rapidly as possible in the high-voltage potential concerned, in which the voltage is reduced compared to the reference potential, the discharge resistor and, advantageously electrically parallel thereto, an uncharged protective capacitor are connected. The voltage between the high-voltage potential concerned compared to the reference potential thereby suddenly jumps to a much lower level, as a result of which the body current reduces proportionally to the voltage. The described solution therefore makes it possible to reduce an electric shock caused to the body, in particular the human body, by the Y-capacitors. The requirements described above can therefore be met. It is also possible to limit the electrical energy of the Y-capacitors converted through the body resistance to an amount below 0.2 J, even though the energy stored in the Y-capacitors may be significantly higher.

The combination of discharge resistor and protective capacitor electrically connected in parallel is particularly advantageous. The discharge resistor ensures that the protective capacitor electrically connected in parallel was voltage-free at the moment of activation. After activation, it ensures rapid discharging of the Y-capacitors of the high-voltage potential concerned.

Since it is not only the protective capacitor that is electrically connected in parallel with the discharge resistor, but also the electric series circuit consisting of the protective capacitor and the protective resistor, a current is advantageously limited across/via the protective capacitor by means of the protective resistor.

Due to the additional fast discharge resistor, which is connected electrically in parallel with at least the protective capacitor or with the protective capacitor and the protective resistor, the protective circuit of the described solution can moreover provide an equivalent discharge path to the body current each time a high-voltage potential, i.e., the positive potential or the negative potential, is touched in quick succession. Without this additional fast discharge resistor, after it is activated for the first time, the protective capacitor would be charged to 80 V, for example, depending on its capacitance in relation to the capacitance of the Y-capacitors of the high-voltage system. If it is very quickly activated again with this voltage, a slightly higher voltage would be applied across the human body at the end because the charge in the protective circuit has not been completely dissipated. The protective function would therefore be reduced with each further activation in quick succession. It would therefore either be necessary to wait until the protective capacitor has been discharged to a very low voltage value via the discharge resistor, or this protective circuit would represent a decreasing protective effect in the event of physical contact with a high-voltage potential multiple times in quick succession, because the protective capacitor would still have a residual voltage and could no longer store as much energy. This problem is solved by the protective circuit described because this protective circuit is extended by a fast discharge circuit for the fast discharge of the protective capacitor. As described, the respective circuit breaker is initially activated. After charging the protective capacitor, this circuit breaker is opened again. The protective capacitor is now discharged by the parallel fast discharge resistor and the fast discharge switch is closed. Once the protective capacitor has been discharged, the fast discharge switch is opened again and the protective circuit is ready for use again.

It is therefore advantageously provided that the safety device described here, in particular the protective circuit thereof, is designed in such a way that it is able to be activated independently, i.e., to close the first and/or second circuit breaker, and to open the respective closed circuit breaker again after a short dwell time in this activated state. Communication within the vehicle to a superordinate control unit, which carries out measures such as opening contactors, in particular charging contactors and/or main contactors, and discharging the Y-capacitors, is advantageously dispensed with here. The detection of a permanently applied insulation fault, i.e., a low insulation resistance and not, for example, a defective protective sheath of a high-voltage cable, is advantageously detected by another device, for example by an insulation monitor and/or by a measurement of a high-voltage potential distribution, which is not part of the safety device described here and its protective circuit and is also not connected with this. As mentioned, the safety device described here and its protective circuit are able to trip repeatedly at very short intervals and thus also in the event of rapidly recurring contact by a person, thus ensuring protection for the person. Accidental tripping, for example due to EMC interference, does not lead to further measures in the vehicle, such as an erroneous switch-off of the high-voltage system. The independent functioning of the safety device, in particular of its protective circuit, means that it can be flexibly and easily integrated into an existing high-voltage system. The independent functioning moreover reduces the safety requirements placed on the safety device and its protective circuit, for example the need for a secure functioning/communication with another control device is eliminated.

Exemplary embodiments of the invention are explained in detail hereinbelow with reference to drawings.

BRIEF DESCRIPTION OF THE DRAWING FIGURES

Figure 2:
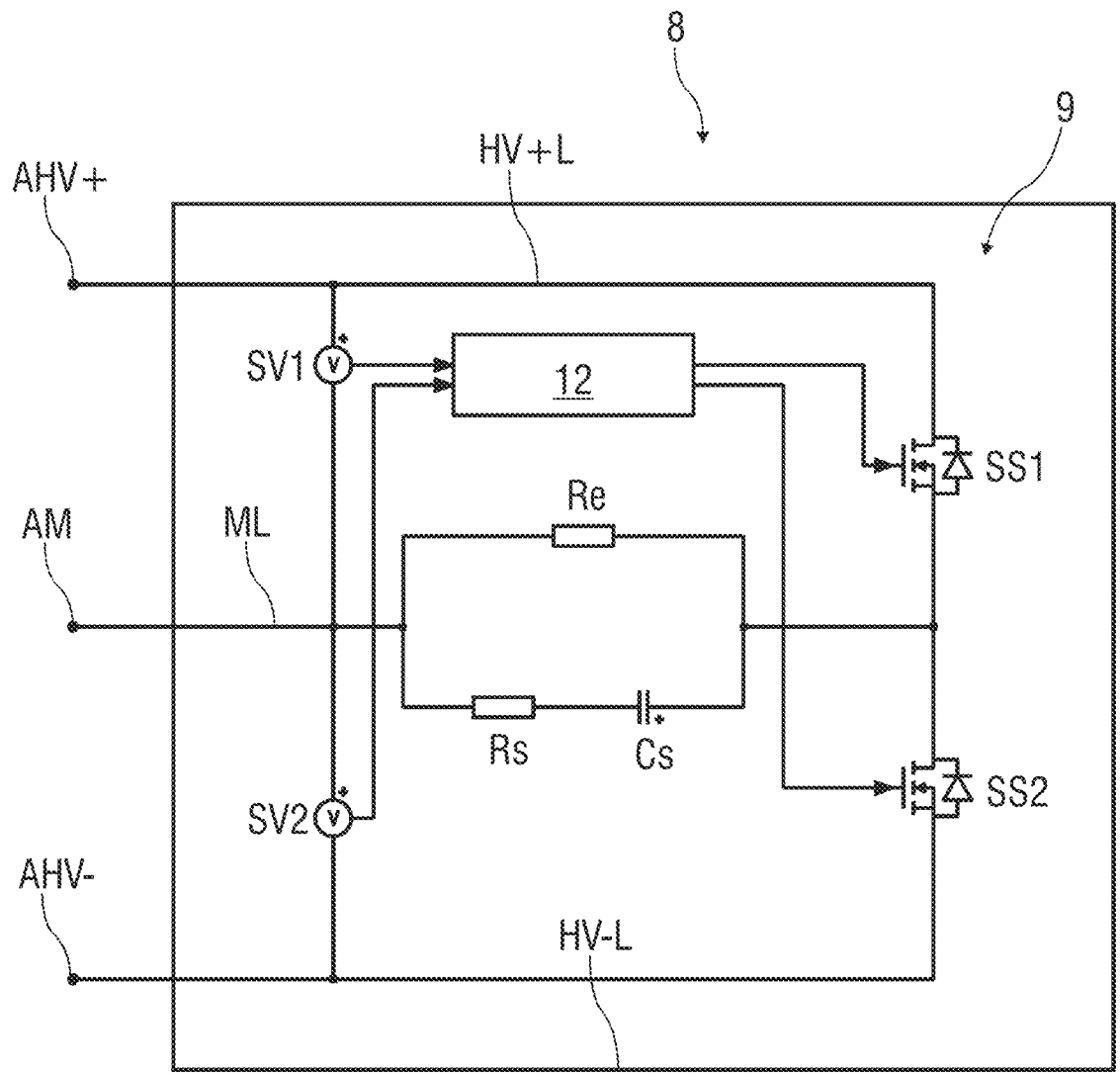
Figure 3:
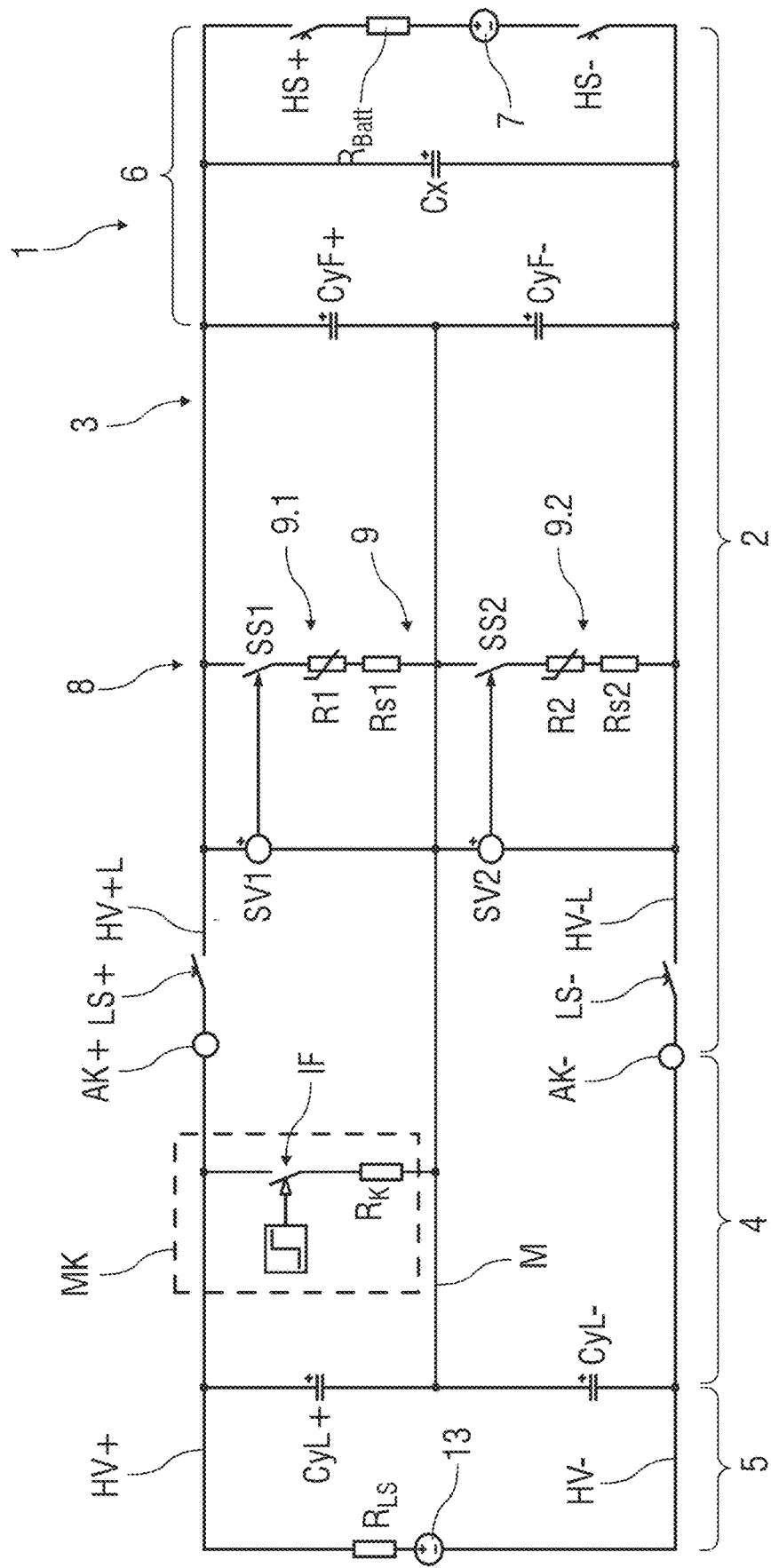
Figure 4:
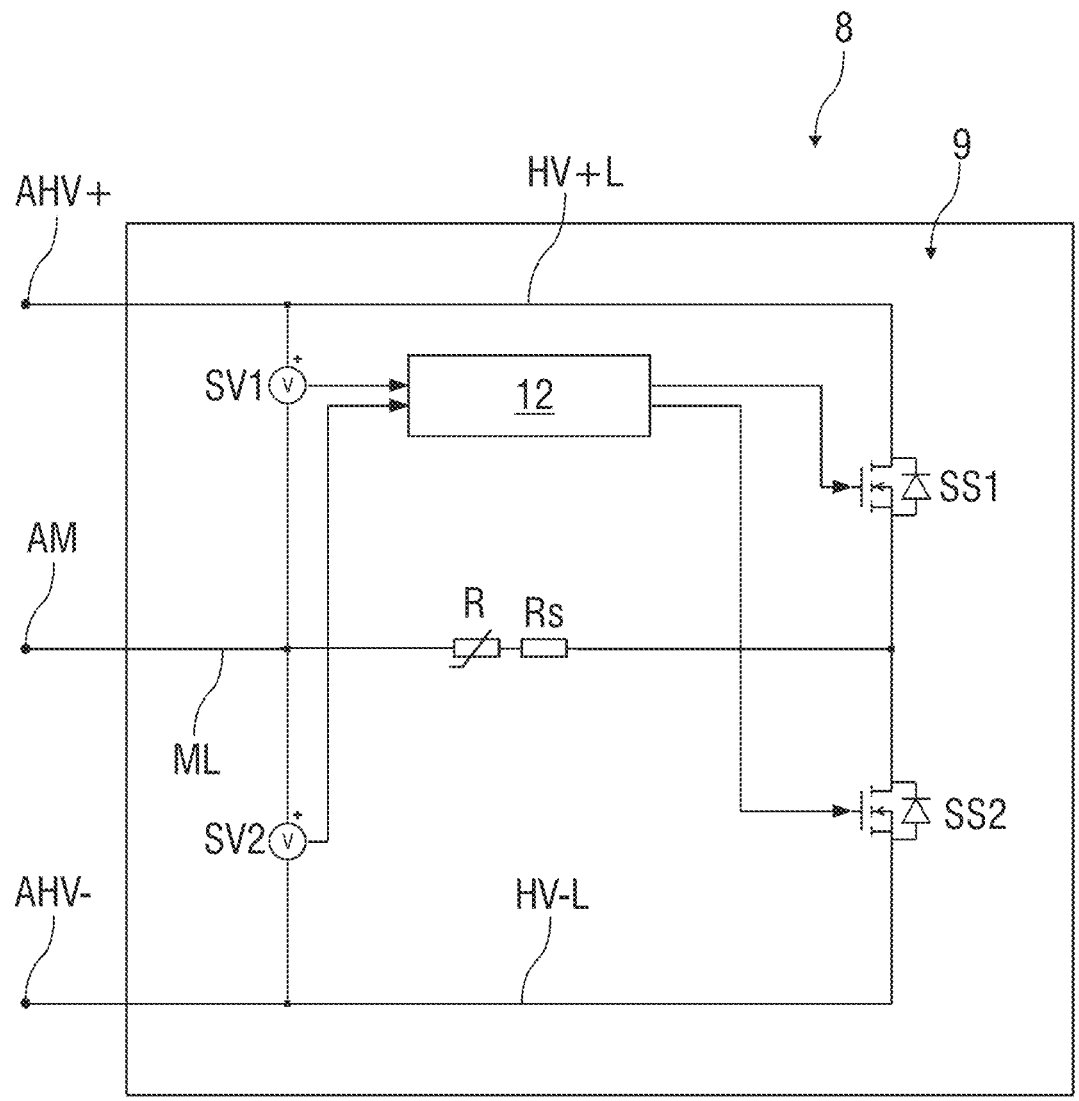
Figure 5:
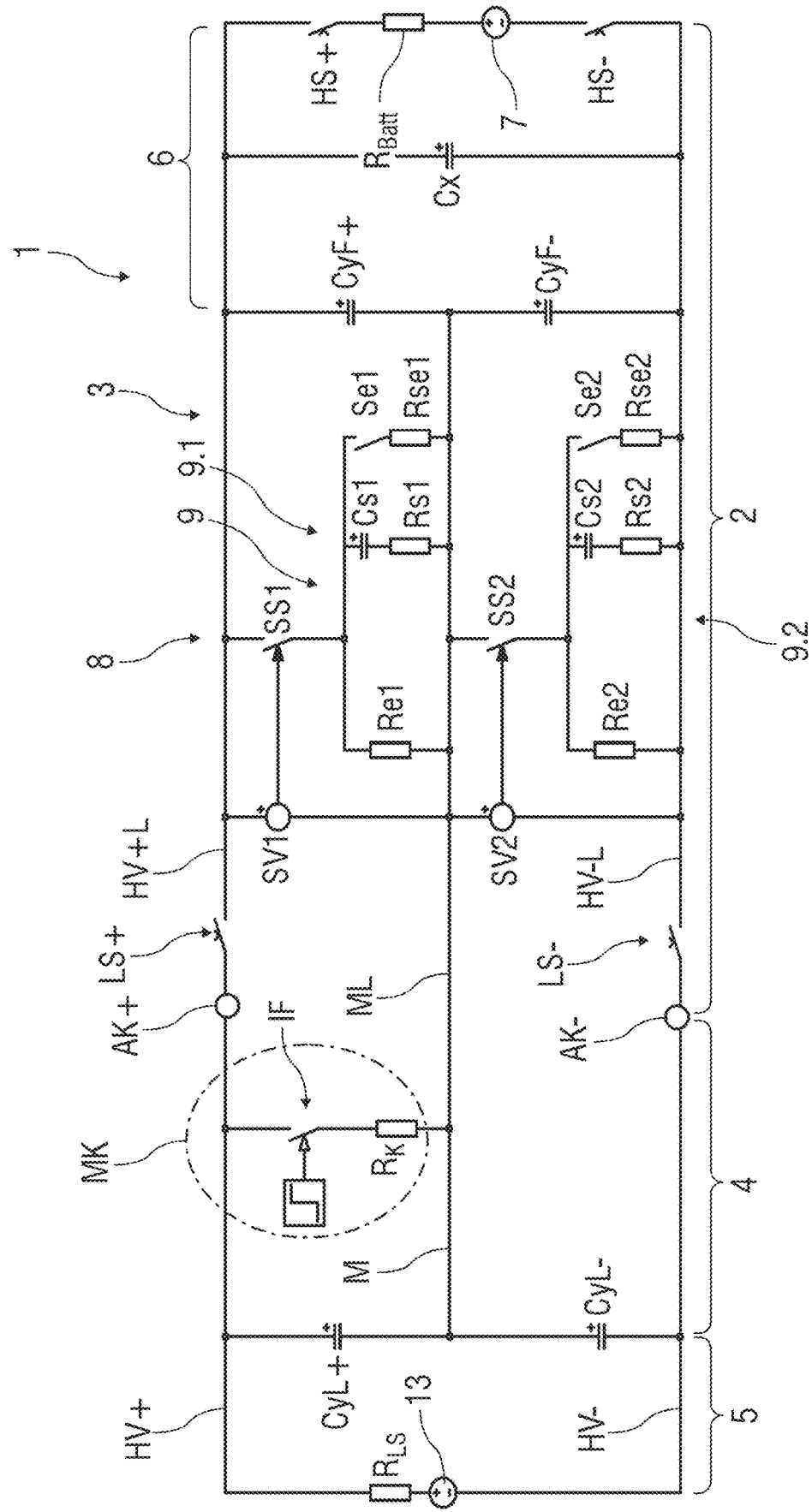
Figure 6:
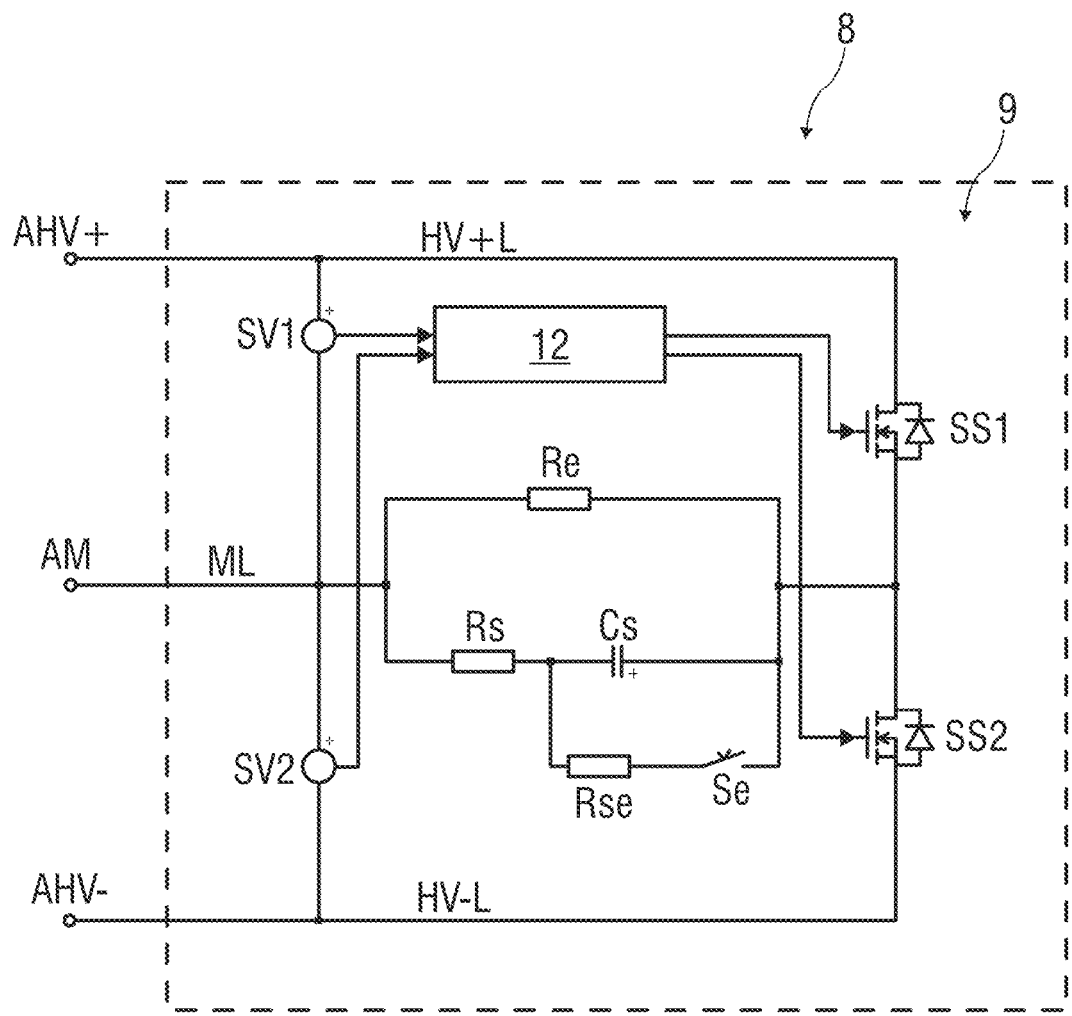

In the drawings:

FIG. 1 schematically shows an embodiment of a DC grid with an embodiment of a safety device, FIG. 2 schematically shows an embodiment of a safety device, FIG. 3 schematically shows a further embodiment of a DC grid with an embodiment of a safety device, FIG. 4 schematically shows a further embodiment of a safety device, FIG. 5 schematically shows a further embodiment of a DC grid with an embodiment of a safety device, and FIG. 6 schematically shows a further embodiment of a safety device.

Mutually corresponding parts are provided with the same reference signs in all figures.

DETAILED DESCRIPTION

A safety device 8 for an electric DC grid 1, in particular for a high-voltage electrical network, for example for an onboard electrical system 3 of a vehicle 2 is described below with reference to FIGS. 1 to 6. The safety device comprises a first voltage measuring device SV1 between a positive potential line HV+L and a reference potential line ML for measuring a voltage between the positive potential line HV+L and the reference potential line ML and a second voltage measuring device SV2 between a negative potential line HV−L and the reference potential line ML for measuring a voltage between the negative potential line HV−L and the reference potential line ML. The reference potential M is, in particular, an electric earth potential, when using the safety device 8 in a vehicle 2, in particular a vehicle earth potential, when using the safety device 8 in a DC charging station 5, for example an earth potential.

Furthermore, the safety device 8 comprises a protective circuit 9, in particular for reducing an electric shock, in particular to a person, i.e. to a human body, caused by Y-capacitors CyF+, CyF−, CyL+, CyL− of the electric DC grid 1.

The protective circuit 9 comprises a first circuit breaker SS1 between the positive potential line HV+L and the reference potential line ML and a second circuit breaker SS2 between the negative potential line HV−L and the reference potential line ML. A plurality of tripping criteria are predefined, wherein the first circuit breaker SS1 and/or the second circuit breaker SS2 can be actuated so as to close exclusively in the event of all predefined tripping criteria being met as determined by means of the first voltage measuring device SV1 and/or by means of the second voltage measuring device SV2. The tripping criteria relate, in particular, to fault causes/interference that may occur and the occurrence of which is intended to prevent the circuit breaker SS1, SS2 from closing. Advantageously, at least one tripping criterion is predefined for each of these fault causes/interference in such a way that it is met in the event of physical contact, i.e., when a person, i.e., a human body, comes into contact with one of the high-voltage potentials HV+, HV−, and is not met when the respective fault cause occurs. Tripping, i.e., closing the respective circuit breaker SS1, SS2, is only effected if all of the predefined tripping criteria come into effect, i.e., are met. This ensures that the respective circuit breaker SS1, SS2 is only closed in the event of physical contact, i.e., when a person, i.e. a human body, comes into contact with one of the high-voltage potentials HV+, HV− and that erroneous closing due to the occurrence of one or a plurality of the fault causes/interference is reliably avoided.

An electric onboard system 3, in particular high-voltage onboard electrical system 3, for a vehicle 2, in particular for an electric vehicle or hybrid vehicle, comprises such a safety device 8.

A vehicle 2, in particular electric vehicle or hybrid vehicle, comprises such a safety device 8, in particular such an electric onboard system 3, in particular high-voltage onboard electrical system 3, with such a safety device 8.

An, in particular vehicle-external, DC charging station 5, in particular high-voltage DC charging station, in particular for electrically charging a vehicle 2, in particular an electric vehicle or a hybrid vehicle, in particular a high-voltage battery 6 of such a vehicle 2, comprises such a safety device 8.

The voltages measured by means of the voltage measuring devices SV1, SV2 are evaluated in particular as follows:
  determining deviations of presently applied voltages dU from positive potential line HV+L to reference potential line ML and from negative potential line HV−L to reference potential line ML in relation to a previously determined voltage value, and/or
  determining voltage changes dU/dt, i.e., over time, of the voltages from positive potential line HV+L to reference potential line ML and from negative potential line HV−L to reference potential line ML, and/or
  considering the opposite sign, in particular in the case of the above two determinations, with respect to the evaluation of the voltages from positive potential line HV+L to reference potential line ML and from negative potential line HV−L to reference potential line ML, and/or
  considering a cyclical repetition of any fault that occurs.
The tripping criteria thus particularly comprise:
  the voltage deviation of the voltage currently applied between the positive potential line HV+L and the reference potential line ML and the voltage applied between the negative potential line HV−L and the reference potential line ML from a previously determined voltage value, and/or
  the voltage changes over time in the voltage applied between the positive potential line HV+L and the reference potential line ML and the voltage applied between the negative potential line HV−L and the reference potential line ML, and/or
  the voltage applied between the positive potential line HV+L and the reference potential line ML is of the opposite sign to the voltage applied between the negative potential line HV−L and the reference potential line ML, and/or
  the absence of a cyclical repetition of the other tripping criteria.
The first circuit breaker SS1 and/or the second circuit breaker SS2 can then only be actuated, in particular, if
  the voltage currently applied between the positive potential line HV+L and the reference potential line ML and the voltage applied between the negative potential line HV−L and the reference potential line ML deviates from the previously determined voltage value by more than a predefined limit value, in one possible embodiment a limit value of 30 V, and
  the voltage changes over time of the voltage applied between the positive potential line HV+L and the reference potential line ML and the voltage applied between the negative potential line HV−L and the reference potential line ML exceed a predefined limit value, and
  the voltage applied between the positive potential line HV+L and the reference potential line ML is of the opposite sign to the voltage applied between the negative potential line HV−L and the reference potential line ML.
By way of example, a common voltage evaluation unit 12 coupled to the voltage measuring devices SV1, SV2 and to the circuit breakers SS1, SS2 is provided for evaluating the voltage determined by the first voltage measuring device SV1 and the voltage determined by the second voltage measuring device SV2 and for actuating the first circuit breaker SS1 and/or the second circuit breaker SS2 exclusively in the event of all predefined tripping criteria being met as determined by means of the first voltage measuring device SV1 and/or by means of the second voltage measuring device SV2.

FIGS. 1 and 2, 3 and 4, and 5 and 6 show various embodiments of the protective circuit 9, wherein FIGS. 2, 4 and 6 show a component-optimized version of the respective embodiment.

In the examples shown, the high-voltage electrical network 3 is a high-voltage onboard electrical system 3 of a vehicle 2, in particular an electric vehicle or hybrid vehicle, in which the safety device 8 is advantageously used. However, alternatively, or additionally, the safety device 8 can also be used in a DC charging station 5, to which the vehicle 2 and other vehicles, in particular electric vehicles and hybrid vehicles, can be connected to electrically charge a high-voltage battery 6 of the vehicle 2. In the connected state of the vehicle 2, the DC grid 1 then comprises the onboard electrical system 3, in particular high-voltage onboard electrical system 3, of the vehicle 2 and the DC charging station 5. The high-voltage battery 6 of the vehicle 2, which is electrically charged at this DC charging station 5, is used in particular to provide electrical energy for at least one electric drive unit of the vehicle 2 for driving the vehicle 2.

Both in the vehicle 2 and in the DC charging station 5, Y-capacitors CyF+, CyF−, CyL+, CyL− are used as measure to reduce the emission of EMC interference (EMC=electromagnetic compatibility). In particular, Y-capacitors CyF+, CyF−, CyL+, CyL− are usually more favorable and more compact EMC filter measures compared to inductive interference filters, for example common-mode or differential-mode chokes. From an EMC point of view, it would thus be advantageous to use Y-capacitors CyF+, CyF−, CyL+, CyL− with large capacitance values.

However, one disadvantage of an electrified vehicle 2, i.e., an electric vehicle or hybrid vehicle, is, for example, that an energy content of the Y-capacitors CyF+, CyF−, CyL+, CyL− can be felt by a vehicle user if they are able to touch a high-voltage potential HV+, HV− and is simultaneously in contact with the earth potential. The user then receives an electric shock. Depending on the magnitude of this electric shock, this can be a health risk. For example, it can lead to ventricular fibrillation or death. Such an electric shock represents a so-called a "single fault" and must be avoided. Therefore, this energy content of the Y-capacitors CyF+, CyF−, CyL+, CyL− is limited by standards in order to rule out any danger to the vehicle user.

From a high-voltage safety point of view, small capacitance values of the Y-capacitors CyF+, CyF−, CyL+, CyL− are thus advantageous. According to standards, for example governed by regulation LV123, there is a requirement not to exceed a maximum energy content, in particular 0.2 J, in the Y-capacitors CyF+, CyF−, CyL+, CyL− or to provide alternative measures, for example increased insulation. However, this always has the result that when coupling two high-voltage systems, for example vehicle 2 and DC charging station 5, if the increased insulation is selected as an alternative measure, both participants must always have this increased insulation at the same time. This cannot currently be guaranteed, however.

In other standards, for example SAE J1772, IEC 60479-1 and IEC60479-2, it is not the energy content of the Y-capacitors CyF+, CyF−, CyL+, CyL− that is specified as an amount that is hazardous to health and must not be exceeded, but a charge quantity that must not exceed a predefined value is specified as a harmful parameter. By way of example, a graph showing the relationship between a duration a body current and a value of body current is given. An alternative approach, such as increased insulation is not accepted here.

FIGS. 1, 3 and 5 show a circuit configuration of the respective embodiment of the electric DC grid 1 in the form of a high-voltage electrical network during a DC charging process of the vehicle 2. The DC grid 1 therefore comprises the high-voltage onboard electrical system 3 of the vehicle 2 and the DC charging station 5 connected thereto by means of a charging cable 4. In the example illustrated, the charging cable 4 is already connected to connection contacts AK+, AK− of a DC charging connection of the vehicle 2 and charging contactors LS+, LS− of the vehicle 2 in high-voltage potential lines HV+L, HV−L are still open.

On the left-hand side is the DC charging station 5 with a charging station voltage source 13, a charging station internal resistor $R_{LS}$ and the Y-capacitors CyL+, CyL−.

The charging cable 4 is shown to the right of the DC charging station 5.

Shown to the right of the charging cable 4 is the vehicle 2 with its high-voltage onboard electrical system 3, comprising the charging contactors LS+, LS−, the Y-capacitors CyF+, CyF−, for example EMC filter, an X-capacitor Cx, for example a DC intermediate circuit, and the high-voltage battery 6 with its main contactors HS+, HS−. The high-voltage battery 6 is shown as an electric battery energy source 7, comprising for example a plurality of individual cells connected electrically in series and/or in parallel, with a battery internal resistor $R_{Batt}$.

In addition, the human body MK is shown in this circuit diagram with a body resistance $R_K$ and a switch symbol for an insulation fault IF, for example in the case of a defective charging cable 4, here, for example, a fault at the positive potential HV+. The insulation fault IF can also occur at the negative potential HV−. This is not shown here. If the insulation fault IF occurs, the switch symbol is closed. In the case of such an insulation fault IF and contact of the human body MK with one of the high-voltage potentials HV+, HV− and a reference potential M, a discharge is effected through the human body MK.

In order to avoid this discharge through the human body MK or at least to reduce it to a permissible level, in particular in terms of a health hazard, the safety device 8 is provided with the protective circuit 9 to reduce the electric shock caused by the Y-capacitors CyF+, CyF−, CyL+, CyL−. In all the examples shown, the safety device 8 comprises the two voltage measuring devices SV1, SV2 and the protective circuit 9 with the two circuit breakers SS1, SS2. This switches a discharge network between the positive potential HV+ and the reference potential M, in particular the earth of the body shell, or a discharge network between the negative potential HV− and the reference potential M, in particular the earth of the body shell. In the example according to FIGS. 1, 3 and 5, these discharge networks are the protective circuit parts 9.1, 9.2 of the protective circuit 9.

In the embodiment according to FIGS. 1 and 2, the respective discharge network, i.e., the respective protective circuit part 9.1, 9.2, consists preferably of an uncharged capacitor, referred to hereinafter as protective capacitor Cs, Cs1, Cs2, and a resistor connected electrically in parallel, referred to hereinafter as discharge resistor Re, Re1, Re2. A protective resistor Rs, Rs1, Rs2 is additionally provided, which is electrically connected in series to the protective capacitor Cs, Cs1, Cs2. Also, for example, only the discharge resistor Re, Re1, Re2 could be provided, but this must have a very low impedance in order to reduce the body current quickly. However, a disadvantage is that this creates a low-impedance insulation fault. Therefore, only the combination with protective capacitor Cs, Cs1, Cs2 and discharge resistor Re, Re1, Re2 is considered below.

The respective discharge resistor Re, Re1, Re2 ensures that the protective capacitor Cs, Cs1, Cs2 electrically connected in parallel was voltage-free at the moment it was activated. After activation, it ensures a rapid discharge of the Y-capacitors CyF+, CyF−, CyL+, CyL− of the high-voltage potentials HV+, HV− concerned. In the example shown according to FIG. 1, the safety device 8 with the protective circuit 9 is shown arranged in the vehicle 2. However, it can also be arranged in the DC charging station 5 to fulfil the same function.

During the DC charging process, although the high-voltage potentials HV+, HV− do not necessarily have to be distributed symmetrically in relation to the reference potential M, an insulation value to be maintained as a minimum of the high-voltage potentials HV+, HV− in relation to the reference potential M must be ensured, for example greater than 100 Ohm/Volt. Human contact with a high-voltage potential HV+, HV− results in a reduction in insulation resistance and, as a result, in a shift in the high-voltage potentials HV+, HV− in relation to the reference potential M.

Although an insulation monitor in the vehicle 2 or in the DC charging station 5 monitors the insulation resistances cyclically, the time span of a maximum of 30 seconds in the vehicle 2 or a maximum of two minutes in the DC charging station 5 before an insulation fault IF is detected is far too long to be able to protect a person from a shock caused by the energy stored in the Y-capacitors CyF+, CyF−, CyF+, CyF− in the case of open insulation.

The mode of operation of the safety device 8 with its protective circuit 9 for reducing a Cy-shock is based, for example, on the limit values described in the standard SAE J1772, IEC 60479-1 and IEC60479-2 with regard to the hazard potential. In this case, the harmful parameter is the charge quantity that flows through the human body MK and is shown in a diagram. The aim is therefore to detect and reduce the body current as quickly as possible in order to minimize the charge that flows through. Actuation of the mechanical charging contactors LS+, LS− and/or main contactors HS+, HS− alone would be too slow for this purpose.

In the case of the above-described protective circuit 9, a drop in the insulation value is quickly detected by the voltage measurement, and the discharged protective capacitor Cs, Cs1, Cs2 is immediately connected in parallel to the concerned high-voltage potential HV+, HV− with body resistance $R_K$ or Y-capacitor CyF+, CyF−, CyL+, CyL−, for example via a hardware connection. Thus, the voltage across this high-voltage potential HV+, HV− and the reference potential M decreases abruptly. The current flow through the human body MK decreases proportionally with the voltage reduction.

The discharge resistor Re, Re1, Re2 has two functions. Firstly, it ensures that the protective capacitor Cs, Cs1, Cs2 is completely discharged before it is activated. Secondly, after activation, it accelerates the reduction of the already reduced voltage between this high-voltage potential HV+, HV− and the reference potential M, whereby the current through the human body MK is further reduced as the voltage continues to fall. The respective other high-voltage potential HV−, HV+ increases its voltage in relation to the reference potential M to the same extent, but is not touched by the human body MK and is thus not critical. In a further step, the main contactors HS+, HS− of the high-voltage battery 6 are advantageously opened, contactors in the DC charging station 5 and/or the charging contactors LS+, LS− are opened and, in a final step, the X-capacitor Cx and the Y-capacitors CyF+, CyF− of the vehicle 2 are actively discharged.

The safety device 8 with its protective circuit 9 can be used to comply with predefined standards, for example the standard IEC 60479-1. The higher the DC charging voltage, the higher the voltage applied across the Y-capacitors CyF+, CyF−, CyL+, CyL−. In the case of an assumed body resistance $R_K$, this also results in a higher current proportional to the voltage of the Y-capacitors CyF+, CyF−, CyL+, CyL− when they are first touched. The current through the body decreases over the course of a capacitor discharge via a resistor, in particular in the form of an exponential function. The current at the start of the contact is calculated from the quotient of voltage and resistance. In the case of an assumed maximum charging voltage of 920 V and a high-voltage potential distribution that is also assumed to be symmetrical in relation to the reference potential M (460V across each Y-capacitor), the initial value of the contact current is 460 V/1200 ohms=383 mA. Starting from this initial value of the current, this current can be converted to a sinusoidal AC current by dividing by root 6. This corresponds to the value on the X axis in the so-called C1 characteristic curve in the standard SAE J 1772. The time duration of this current can be determined by calculating the time constant of the capacitor discharge t=R×C. The corresponding time duration (Y axis) corresponds to 3×t. For example, a dwell time in this state of approx. 100 ms is still permissible. A residual body current of less than 5 mA was selected as a target, i.e. the residual voltage must be less than 6 V.

The higher the voltage across a Y-capacitor CyF+, CyF−, CyL+, CyL−, for example in the case of an asymmetrical high-voltage potential distribution in relation to the reference potential M, the shorter the maximum dwell time. A current above 500 mA is not permitted, because a maximum voltage of 600 V across a Y-capacitor CyF+, CyF−, CyL+, CyL− would occur in this case. The charging process must be aborted above this value.

The safety device 8 with its protective circuit 9 can therefore be used to calculate whether it is still able to maintain the required maximum current time durations. If this condition is not met, the charging process must be aborted immediately, as a further fault would endanger a person. Input variables for this calculation are voltage measurements across the Y-capacitors CyF+, CyF−, CyL+, CyL− of both high-voltage potentials HV+, HV−, knowledge of the circuit's own reaction speed and the table of values of the maximum permissible current dwell times.

A voltage evaluation unit 12 is provided here, in which voltages detected by means of the voltage measuring devices SV1, SV2 are analyzed and the circuit breakers SS1, SS2 can be actuated accordingly. It can furthermore be provided that this voltage evaluation unit 12 can output other information, in particular to slower control units or to the DC charging station 5. Examples of information include an opening or closing of the charging contactors LS+, LS−, an interruption of the DC charging process, an opening or closing of the main contactors HS+, HS− of the high-voltage battery 6, an initiation of the active discharging of the high-voltage intermediate circuit of the vehicle 2, and/or information that everything is in order and that the DC charging process can thus be started.

In the case of a DC grid 1 without the DC charging station 5, in particular for a driving operation of the vehicle 2, an AC charging operation and for installation and servicing, the only difference to the state during DC charging is that the DC charging station 5 is missing. Examples of fault mechanisms include a defective high-voltage cable or a defective housing of a high-voltage electronic system as a result of an accident. The safety device 8 with its protective circuit 9 can also reduce the charge quantity if the high-voltage system is damaged during installation or servicing.

The protective circuit 9 for reducing the Y-shock caused by an insulation fault IF is identical to that described above. For this purpose, the safety device 8 with its protective circuit 9 is naturally arranged in the vehicle 2. The mode of operation is identical to that described above for insulation faults during the DC charging. When the reduction in the voltage between one of the high-voltage potentials HV+, HV− and the reference potential M is detected, the respective protective capacitor Cs, Cs1, Cs2 is connected and the total capacitance of the Y-capacitors CyF+, CyF−, CyL+, CyL− of the affected high-voltage potentials HV+, HV− is discharged. Moreover, the main contactors HS+, HS− of the high-voltage battery 6 are commanded to open and active discharging of the X-capacitor Cx and both Y-capacitors CyF+, CyF− of the vehicle 2 is initiated. The charging contactors LS+, LS− have already been opened beforehand and also always remain open.

FIG. 2 shows the component-optimized protective circuit 9. In the protective circuit 9 for reducing a Cy-shock it can be assumed that only one high-voltage potential HV+, HV− is connected to the reference potential M, for example the housing earth, via the body resistance $R_K$. If both high-voltage potentials HV+, HV− were connected to the reference potential M, in particular the housing earth, this would be equivalent to a short circuit of the high-voltage battery 6 or DC charging station 5, which would have to be disconnected by a fuse or a current sensor with a cut-off device controlled by the latter.

It is therefore evident that the protective circuit 9 for reducing a Cy-shock for the positive potential HV+ and the negative potential HV− is never used at the same time. Thus, a single protective capacitor Cs, discharge resistor Re and moreover protective resistor Rs can be used to provide both potentials HV+, HV− with short-circuit protection, as shown in FIG. 2. This means that two protective circuit parts 9.1, 9.2 are not required. The voltage measurements by means of the two voltage measuring devices SV1, SV2 and the two circuit breakers SS1, SS2 for activating the protective circuit 9 have to be retained. FIG. 2 shows such a component optimization. This is expedient if, for example, the discharge resistor Re also has to assume larger component values due to high operating voltages or large capacitances of the Y-capacitors CyF+, CyF−, CyL+, CyL− in the vehicle 2 and the DC charging station 5. The safety device 8, in particular its protective circuit 9, is reduced here to the necessary additional outlay to be integrated in the vehicle 2 or at the DC charging station 5. Connections AHV+, AHV−, AM to the positive potential HV+, negative potential HV− and reference potential M can be kept very small, as a current in the millisecond range only flows in the event of a fault. Otherwise, the connections AHV+, AHV−, AM are current-free and are only used for the voltage measurement. The result is that the safety device 8 with its protective circuit 9 can be quickly integrated into an existing high-voltage system with only minor changes. If more planning time is available, this function can of course also be integrated into an existing device.

The protective circuit 9 thus comprises the one electric series circuit consisting of the discharge resistor Re and the first circuit breaker SS1 between the positive potential line HV+L and the reference potential line ML and the electric series circuit consisting of the, i.e., the same, discharge resistor Re and the second circuit breaker SS2 between the negative potential line HV−L and the reference potential line ML, as shown in FIG. 2.

Alternatively, the protective circuit 9 comprises two protective circuit parts 9.1, 9.2, wherein the first protective circuit part 9.1 comprises the electric series circuit consisting of the first discharge resistor Re1 and the first circuit breaker SS1 between the positive potential line HV+L and the reference potential line ML and the second protective circuit part 9.2 comprises the electric series circuit consisting of the second discharge resistor Re2 and the second circuit breaker SS2 between the negative potential line HV−L and the reference potential line ML, as shown in FIG. 1.

The protective capacitor Cs, Cs1, Cs2 is advantageously, as already mentioned above, electrically connected in parallel to the discharge resistor Re, Re1, Re2, i.e., the sole protective capacitor Cs is electrically connected in parallel to the sole discharge resistor Re, as shown in FIG. 2, or the respective protective capacitor Cs1, Cs2 is electrically connected in parallel to the discharge resistor Re1, Re2 of the respective protective circuit part 9.1, 9.2, as shown in FIG. 1.

The protective circuit 9 thus comprises the electric series circuit consisting of the discharge resistor Re and the first circuit breaker SS1 between the positive potential line HV+L and the reference potential line ML and the electric series circuit consisting of the discharge resistor Re and the second circuit breaker SS2 between the negative potential line HV−L and the reference potential line ML, wherein the protective capacitor Cs is electrically connected in parallel to the discharge resistor Re, as shown in FIG. 2. Alternatively, the protective circuit 9 comprises the two protective circuit parts 9.1, 9.2, wherein the first protective circuit part 9.1 comprises the electric series circuit consisting of the first discharge resistor Re1 and the first circuit breaker SS1 between the positive potential line HV+L and the reference potential line ML, wherein the first protective capacitor Cs1 is electrically connected in parallel to the first discharge resistor Re1, and wherein the second protective circuit part 9.2 comprises the electric series circuit consisting of the second discharge resistor Re2 and the second circuit breaker SS2 between the negative potential line HV−L and the reference potential line ML, wherein the second protective capacitor Cs2 is electrically connected in parallel to the second discharge resistor Re2, as shown in FIG. 1.

In the examples shown here, not only is the protective capacitor Cs, Cs1, Cs2 electrically connected in parallel to the discharge resistor Re, Re1, Re2, but an electric series circuit consisting of the protective capacitor Cs, Cs1, Cs2 and a protective resistor Rs, Rs1, Rs2 is electrically connected in parallel.

The protective circuit 9 thus comprises the electric series circuit consisting of the discharge resistor Re and the first circuit breaker SS1 between the positive potential line HV+L and the reference potential line ML and the electric series circuit consisting of the discharge resistors Re and the second circuit breaker SS2 between the negative potential line HV−L and the reference potential line ML, wherein the electric series circuit consisting of the protective capacitor Cs and the protective resistor Rs is electrically connected in parallel to the discharge resistor Re, as in shown FIG. 2. Alternatively, the protective circuit 9 comprises the two protective circuit parts 9.1, 9.2, wherein the first protective circuit part 9.1 comprises the electric series circuit consisting of the first discharge resistor Re1 and the first circuit breaker SS1 between the positive potential line HV+L and the reference potential line ML, wherein the electric series circuit consisting of the first protective capacitor Cs1 and the first protective resistor Rs1 is electrically connected in parallel to the first discharge resistor Re1, and wherein the second protective circuit part 9.2 comprises the electric series circuit consisting of the second discharge resistor Re2 and the second circuit breaker SS2 between the negative potential line HV−L and the reference potential line ML, wherein the electric series circuit consisting of the second protective capacitor Cs2 and the second protective resistor Rs2 is electrically connected in parallel to the second discharge resistor Re2, as shown in FIG. 1.

FIGS. 3 and 4 show a further embodiment of the safety device 8, in particular of its protective circuit 9, with FIG. 4 showing the component-optimized version.

The respective discharge network, in FIG. 3, therefore the respective protective circuit part 9.1, 9.2, preferably consists of an electric series circuit consisting of a resistor R, R1, R2 and a protective resistor Rs, Rs1, Rs2.

In the example shown, the electric resistor R, R1, R2 is, for example, a voltage-dependent electric resistor, which is designed in such a way that a resistance value of the voltage-dependent electric resistor is reduced, in particular increasingly reduced, as the electric voltage across connections of the voltage-dependent electric resistor increases, wherein a maximum resistance value of the voltage-dependent electric resistor is, for example, at most 800Ω, in particular at most 600Ω, in particular less, in particular significantly less than, a human body resistance $R_K$, i.e., than a body resistance of a person, in particular is at most 200Ω is, in particular is at most or less than 50Ω, for example is less than 5Ω. As a result, the flow of current through the human body is significantly reduced. The voltage-dependent resistor is, for example, designed as a varistor or as a series circuit and/or parallel circuit consisting of a plurality of varistors, for example with and/or without additional circuitry.

Alternatively, the electric resistor R, R1, R2 is an electric resistor with a fixed resistance value of at most 800Ω, in particular at most 600Ω, which is in particular less, in particular significantly less, than the human body resistance $R_K$, i.e., than a body resistance of a person, is in particular at most 200Ω, is in particular at most or less than 50Ω, for example less than 5Ω. As a result, the flow of current through the human body is likewise significantly reduced.

It is also possible, for example, for only the resistor R, R1, R2 to be provided. The electric protective resistor Rs, Rs1, Rs2 is used to prevent the respective circuit breaker SS1, SS2 from being destroyed by too high a current. The electric protective resistor Rs, Rs1, Rs2 can thus be dispensed with, for example, the electric resistor R, R1, R2, in particular in its embodiment as a voltage-dependent electric resistor, always ensures that a maximum current flow is limited in such a way that it cannot lead to the respective circuit breaker SS1, SS2 being destroyed.

In the example shown according to FIG. 3, the safety device 8 with the protective circuit 9 is shown arranged in the vehicle 2. However, it can also be arranged in the DC charging station 5 to fulfil the same function.

In the case of the safety device 8 shown here, in particular the protective circuit 9, in particular the respective protective circuit parts 9.1, 9.2, fault detection is effected via the voltage measurement in relation to the reference potential M.

During the DC charging process, in which the charging contactors LS+, LS− shown open in FIG. 3 are closed, although the high-voltage potentials HV+, HV− do not necessarily have to be distributed symmetrically in relation to the reference potential M, an insulation value to be maintained as a minimum of the high-voltage potentials HV+, HV− compared to (in relation to) the reference potential M must be ensured, for example greater than 100 ohms/volt. Human contact with a high-voltage potential HV+, HV− results in a reduction in insulation resistance and, as a result, in a shift in the high-voltage potentials HV+, HV− in relation to the reference potential M.

Although an insulation monitor in the vehicle 2 or in the DC charging station 5 monitors the insulation resistances cyclically, the time span of a maximum of 30 seconds in the vehicle 2 or a maximum of two minutes in the DC charging station 5 before an insulation fault IF is detected is far too long to be able to protect a person from a shock caused by the energy stored in the Y-capacitors CyF+, CyF−, CyF+, CyF− in the case of open insulation.

The mode of operation of the safety device 8 with its protective circuit 9 for reducing a Cy-shock is based, for example, on the limit values described in the standard SAE J1772, IEC 60479-1 and IEC60479-2 with regard to the hazard potential. In this case, the harmful parameter is the charge quantity which flows through the human body MK and is shown in a diagram. The aim is therefore to detect and reduce the body current as quickly as possible in order to minimize the charge that flows through. Actuation of the mechanical charging contactors LS+, LS− and/or main contactors HS+, HS− alone would be too slow for this purpose.

In the above-described protective circuit 9, a drop in the insulation value is quickly detected by the voltage measurement and the electric resistor R, R1, R2 is immediately connected in parallel to the affected high-voltage potential HV+, HV− with body resistance $R_K$ and Y-capacitor CyF+, CyF−, CyL+, CyL−, for example via a hardware connection. The voltage across this high-voltage potential HV+, HV− and the reference potential M therefore decreases abruptly. The flow of current through the human body MK decreases proportionally with the voltage reduction.

The respective other high-voltage potential HV−, HV+ increases its voltage in relation to the reference potential M to the same extent, but it is not touched by the human body MK and is thus not critical.

In a further step, advantageously the main contactors HS+, HS− of the high-voltage battery 6 are opened, contactors in the DC charging station 5 and/or the charging contactors LS+, LS− are opened and, in a final step, the X-capacitor Cx and the Y-capacitors CyF+, CyF− of the vehicle 2 are actively discharged.

The safety device 8 with its protective circuit 9 can be used to comply with predefined standards, for example the standard IEC 60479-1. The higher the DC charging voltage, the higher the voltage applied across the Y-capacitors CyF+, CyF−, CyL+, CyL−. In the case of an assumed body resistance $R_K$, this also results in a higher current proportional to the voltage of the Y-capacitors CyF+, CyF−, CyL+, CyL− when they are first touched. The current through the body decreases over the course of a capacitor discharge via a resistor, in particular in the form of an exponential function. The current at the start of the contact is calculated from the quotient of voltage and resistance. In the case of an assumed maximum charging voltage of 920 V and a high-voltage potential distribution that is also assumed to be symmetrical in relation to the reference potential M (460V across each Y-capacitor), the initial value of the contact current is 460 V/1200 ohms=383 mA. Starting from this initial value of the current, this current can be converted to a sinusoidal AC current by dividing by root 6. This corresponds to the value on the X axis in the so-called C1 characteristic curve in the standard SAE J 1772. The time duration of this current can be determined by calculating the time constant of the capacitor discharge t=R×C. The corresponding time duration (Y axis) corresponds to 3×t in this case. For example, a dwell time in this state of approx. 100 ms is still permissible. A residual body current of less than 5 mA was selected as a target, i.e. the residual voltage must be less than 6 V.

The higher the voltage across a Y-capacitor CyF+, CyF−, CyL+, CyL−, for example in the case of an asymmetrical high-voltage potential distribution in relation to the reference potential M, the shorter the maximum dwell time. A current above 500 mA is not permitted, because a maximum voltage of 600 V across a Y-capacitor CyF+, CyF−, CyL+, CyL− would occur in this case. The charging process must be aborted above this value.

The safety device 8 with its protective circuit 9 can therefore be used to calculate whether it is still able to maintain the required maximum current time durations. If this condition is not met, the charging process must be aborted immediately, as a further fault would endanger a person. Input variables for this calculation are voltage measurements across the Y-capacitors CyF+, CyF−, CyL+, CyL− of both high-voltage potentials HV+, HV−, knowledge of the circuit's own reaction speed and the table of values of the maximum permissible current dwell times.

Since the protective circuit 9 can provide an equivalent discharge path to the body current each time a high-voltage potential HV+, HV− is touched in quick succession, it is advantageously provided that the safety device 8 described here, in particular the protective circuit 9 thereof, is designed in such a way that it is able to be activated independently, i.e., to close the first and/or second circuit breaker SS1, SS2, and to open the respective closed circuit breaker SS1, SS2 again after a short dwell time in this activated state. Communication within the vehicle 2 to a superordinate control unit, which carries out measures such as opening contactors, in particular charging contactors LS+, LS− and/or main contactors HS+, HS−, and discharging the Y-capacitors CyF+, CyF−, CyL+, CyL−, is advantageously dispensed with here. The detection of a permanently applied insulation fault, i.e., a low insulation resistance and not, for example, a defective protective sheath of a high-voltage cable, is advantageously detected by another device, for example by an insulation monitor and/or by a measurement of a high-voltage potential distribution, which is not part of the safety device 8 described here and its protective circuit 9 and is also not connected with this. As mentioned, the safety device 8 described here and its protective circuit 9 are able to trip repeatedly at very short intervals and thus also in the event of rapidly recurring contact by a person, thus ensuring protection for the person. Accidental tripping, for example due to EMC interference, does not lead to further measures in the vehicle 2, such as an erroneous switch-off of the high-voltage system. The independent functioning of the safety device 8, in particular of its protective circuit 9, means that it can be flexibly and easily integrated into an existing high-voltage system. The independent functioning moreover reduces the safety requirements placed on the safety device 8 and its protective circuit 9, for example the need for a secure functioning/communication with another control device is eliminated.

The safety device 8 can also be used in the case of a DC grid 1 without the DC charging station 5, in particular for a driving operation of the vehicle 2, an AC charging operation and for installation and servicing. The only difference to the state during DC charging is that the DC charging station 5 is missing. Examples of fault mechanisms include a defective high-voltage cable or a defective housing of a high-voltage electronic system as a result of an accident. The safety device 8 with its protective circuit 9 can also reduce the charge quantity if the high-voltage system is damaged during installation or servicing.

The protective circuit 9 for reducing the Y-shock caused by an insulation fault IF is identical to that described above. For this purpose, the safety device 8 with its protective circuit 9 is naturally arranged in the vehicle 2. The mode of operation is identical to that described above for insulation faults during the DC charging. When the reduction in the voltage between one of the high-voltage potentials HV+, HV− and the reference potential M is detected, the respective electric resistor R, R1, R2 is connected and the total capacitance of the Y-capacitors CyF+, CyF−, CyL+, CyL− of the affected high-voltage potentials HV+, HV− is discharged. Moreover, the main contactors HS+, HS− of the high-voltage battery 6 are commanded to open and active discharging of the X-capacitor Cx and both Y-capacitors CyF+, CyF− of the vehicle 2 is initiated. The charging contactors LS+, LS− have already been opened beforehand and also always remain open.

FIG. 4 shows the component-optimized protective circuit 9. In the protective circuit 9 for reducing a Cy-shock it can be assumed that only one high-voltage potential HV+, HV− is connected to the reference potential M, for example the housing earth, via the body resistance $R_K$. If both high-voltage potentials HV+, HV− were connected to the reference potential M, in particular the housing earth, this would be equivalent to a short circuit of the high-voltage battery 6 or DC charging station 5 which would have to be disconnected by a fuse or a current sensor with a cut-off device controlled by the latter.

It is therefore evident that the protective circuit 9 for reducing a Cy-shock for the positive potential HV+ and the negative potential HV− is never used at the same time. Thus, a single resistor R and optionally a single protective resistor Rs can be used to provide both high-voltage potentials HV+, HV− with short-circuit protection, as shown in FIG. 4. This means that two protective circuit parts 9.1, 9.2 are therefore not required. The voltage measurements by means of the two voltage measuring devices SV1, SV2 and the two circuit breakers SS1, SS2 for activating the protective circuit 9 have to be retained.

The safety device 8, in particular its protective circuit 9, is reduced in FIG. 4 to the necessary additional outlay to be integrated in the vehicle 2 or at the DC charging station 5. Connections AHV+, AHV−, AM to the positive potential HV+, negative potential HV− and reference potential M can be kept very small, as a current in the millisecond range only flows in the event of a fault. Otherwise, the connections AHV+, AHV−, AM are current-free and are only used for the voltage measurement. The result is that the safety device 8 with its protective circuit 9 can be quickly integrated into an existing high-voltage system with only minor changes. If more planning time is available, this function can of course also be integrated into an existing device.

The protective circuit 9 thus comprises, for example as shown in FIG. 4, the electric series circuit consisting of the electric resistor R and the first circuit breaker SS1 between the positive potential line HV+L and the reference potential line ML and the electric series circuit consisting of the, i.e., the same, electric resistor R and the second circuit breaker SS2 between the negative potential line HV−L and the reference potential line ML.

The electric resistor R is, for example, an electric resistor with the above-mentioned fixed resistance value, or, as shown in FIG. 4, a voltage-dependent electric resistor which is designed in such a way that the resistance value of the voltage-dependent electric resistor is reduced, in particular increasingly reduced, as the electric voltage across the connections of the voltage-dependent electric resistor increases, wherein the maximum resistance value is provided as described above. As a result, the flow of current through the human body is significantly reduced.

The electric resistor R designed as a voltage-dependent electric resistor is, for example, designed as a varistor or as a series circuit and/or parallel circuit consisting of a plurality of varistors with and/or without additional circuitry.

Alternatively, the protective circuit 9, as shown in FIG. 3, comprises two protective circuit parts 9.1, 9.2, wherein the first protective circuit part 9.1 comprises the electric series circuit consisting of the first electric resistor R1 and the first circuit breaker SS1 between the positive potential line HV+L and the reference potential line ML and the second protective circuit part 9.2 comprises the electric series circuit consisting of the second electric resistor R2 and the second circuit breaker SS2 between the negative potential line HV−L and the reference potential line ML.

The respective electric resistor R1, R2 is, for example, an electric resistor with the above-mentioned fixed resistance value or, as shown in FIG. 3, a voltage-dependent electric resistor that is designed in such a way that the resistance value of the voltage-dependent electric resistor is reduced, in particular is increasingly reduced, as the electric voltage across the connections of the voltage-dependent electric resistor increases, wherein the maximum resistance value is provided as specified above. As a result, the flow of current through the human body is significantly reduced.

The respective electric resistor R1, R2 designed as a voltage-dependent electric resistor is, for example, designed as a varistor or as a series circuit and/or parallel circuit consisting of a plurality of varistors with and/or without additional circuitry.

In one possible embodiment, as already mentioned above, the electric resistor R, R1, R2 is electrically connected in series with an electric protective resistor Rs, Rs1, Rs2. I.e., the sole electric resistor R is electrically connected in series with the sole electric protective resistor Rs, as shown in FIG. 4, or the electric resistor R1, R2 of the respective protective circuit parts 9.1, 9.2 is electrically connected in series with the electric protective resistor Rs1, Rs2 of the respective protective circuit parts 9.1, 9.2, as shown in FIG. 3.

The electric series circuit consisting of the respective electric resistor R, R1, R2 and the respective electric protective resistor Rs, Rs1, Rs2 forms a discharge network between the positive potential HV+ and the reference potential M and a discharge network between the negative potential HV− and the reference potential M. The electric protective resistor Rs or the respective electric protective resistor Rs1, Rs2 is used to prevent the respective circuit breaker SS1, SS2 from being destroyed by too high a current. The electric protective resistor Rs or the respective electric protective resistor Rs1, Rs2 can, for example, be dispensed with if the electric resistor R or the respective electric resistor R1, R2, in particular in its embodiment as a voltage-dependent electric resistor, always ensures that a maximum current flow is limited in such a way that it cannot lead to the respective circuit breaker SS1, SS2 being destroyed.

If the electric protective resistor Rs and the respective protective resistor Rs1, Rs2 are present, so comprises the protective circuit 9 thus the electric series circuit the electric resistor R, the electric protective resistor Rs and the first circuit breaker SS1 between the positive potential line HV+L and the reference potential line ML and the electric series circuit the resistor R, the electric protective resistor Rs and the second circuit breaker SS2 between the negative potential line HV-L and the reference potential line ML, as shown in FIG. 4, or the protective circuit 9 comprises the two protective circuit parts 9.1, 9.2, wherein the first protective circuit part 9.1 comprises the electric series circuit consisting of the first electric resistor R1, the first electric protective resistor Rs1 and the first circuit breaker SS1 between the positive potential line HV+L and the reference potential line ML and the second protective circuit part 9.2 comprises the electric series circuit consisting of the second electric resistor R2, the second electric protective resistor Rs2 and the second circuit breaker SS2 between the negative potential line HV-L and the reference potential line ML, as shown in FIG. 3.

The above-mentioned human body resistance $R_K$, i.e., body resistance of a person, i.e., the human body MK, is assumed to be a resistance value of 500Ω, in particular according to specifications in the applicable standards.

FIGS. 5 and 6 show a further embodiment of the safety device 8, in particular of its protective circuit 9, with FIG. 6 showing the component-optimized version.

The respective discharge network, i.e., in FIG. 5 the respective protective circuit part 9.1, 9.2, preferably comprises here an uncharged capacitor, referred to hereinafter as protective capacitor Cs, Cs1, Cs2, and a resistor connected electrically in parallel, referred to hereinafter as discharge resistor Re, Re1, Re2. A protective resistor Rs, Rs1, Rs2 is additionally provided that is electrically connected in series to the protective capacitor Cs, Cs1, Cs2. Furthermore, a fast discharge resistor Rse, Rse1, Rse2 is provided parallel to the protective capacitor Cs, Cs1, Cs2 and, for example, also parallel to the protective resistor Rs, Rs1, Rs2, electrically in series with a fast discharge switch Se, Se1, Se2.

The respective discharge resistor Re, Re1, Re2 ensures that the protective capacitor Cs, Cs1, Cs2 electrically connected in parallel was voltage-free at the moment of activation. After activation, it ensures rapid discharging of the Y-capacitors CyF+, CyF-, CyL+, CyL- of the high-voltage potential HV+, HV- concerned.

Due to the additional fast discharge resistor Rse, Rse1, Rse2, the protective circuit 9 can moreover provide an equivalent discharge path to the body current each time a high-voltage potential HV+, HV- is touched in quick succession. Without this additional fast discharge resistor Rse, Rse1, Rse2, the protective capacitor Cs, Cs1, Cs2 would be charged to 80 V, for example, depending on its capacitance in relation to the capacitance of the Y-capacitors CyF+, CyF-, CyL+, CyL- of the high-voltage system. If it is very quickly activated again with this voltage, a slightly higher voltage would be applied across the human body MK at the end because the charge in the protective capacitor Cs, Cs1, Cs2 has not been completely dissipated. The protective function would therefore be reduced with each further activation in quick succession. It would therefore either be necessary to wait until the protective capacitor Cs, Cs1, Cs2 has been discharged to a very low voltage value via the discharge resistor Re, Re1, Re2 or this protective circuit would represent a decreasing protective effect in the event of physical contact with a high-voltage potential HV+, HV- because the protective capacitor Cs, Cs1, Cs2 would still have a residual voltage and could no longer store as much energy. This problem is solved by the protective circuit 9 described because this protective circuit 9 is extended by a fast discharge circuit for the fast discharge of the protective capacitor Cs, Cs1, Cs2. In this case, the respective circuit breaker SS1, SS2 is initially activated. After charging the protective capacitor Cs, Cs1, Cs2, this circuit breaker SS1, SS2 is opened again. The protective capacitors Cs, Cs1, Cs2 is now discharged by the parallel fast discharge resistor Rse, Rse1, Rse2 and the fast discharge switch Se, Se1, Se2 is closed. Once the protective capacitor Cs, Cs1, Cs2 has been discharged, the fast discharge switch Se, Se1, Se2 is opened again and the protective circuit 9 is ready for use again.

It is therefore advantageously provided that the safety device 8 described here, in particular the protective circuit 9 thereof, is designed in such a way that it is able to be activated independently, i.e., to close the first and/or second circuit breaker SS1, SS2, and to open the respective circuit breaker SS1, SS2 again after a short dwell time in this activated state. Communication within the vehicle 2 to a superordinate control unit, which carries out measures such as opening contactors, in particular charging contactors LS+, LS- and/or main contactors HS+, HS-, and discharging the Y-capacitors CyF+, CyF-, CyL+, CyL-, is advantageously dispensed with here. The detection of a permanently applied insulation fault, i.e., a low insulation resistance and not, for example, a defective protective sheath of a high-voltage cable, is advantageously detected by another device, for example by an insulation monitor and/or by a measurement of a high-voltage potential distribution, which is not part of the safety device 8 described here and its protective circuit 9 and is also not connected with this. As mentioned, the safety device 8 described here and its protective circuit 9 are able to trip repeatedly at very short intervals and thus also in the event of rapidly recurring contact by a person, thus ensuring protection for the person. Accidental tripping, for example due to EMC interference, does not lead to further measures in the vehicle 2, such as an erroneous switch-off of the high-voltage system. The independent functioning of the safety device 8, in particular of its protective circuit 9, means that it can be flexibly and easily integrated into an existing high-voltage system. The independent functioning moreover reduces the safety requirements placed on the safety device 8 and its protective circuit 9, for example the need for a secure functioning/communication with another control device is eliminated.

In the example shown according to FIG. 5, the safety device 8 with the protective circuit 9 is shown arranged in the vehicle 2. However, it can also be arranged in the DC charging station 5 to fulfil the same function.

In the case of the safety device 8 shown here, in particular the protective circuit 9, in particular the respective protective circuit parts 9.1, 9.2, fault detection is effected via the voltage measurement based on the reference potential M.

During a DC charging process, in which the charging contactors LS+, LS- shown open in FIG. 5 are closed, although the high-voltage potentials HV+, HV- do not necessarily have to be distributed symmetrically in relation to the reference potential M, an insulation value to be maintained as a minimum of the high-voltage potentials HV+, HV- compared to (in relation to) the reference potential M must be ensured, for example greater than 100 ohms/volt. Human contact with a high-voltage potential HV+, HV− results in a reduction in insulation resistance and, as a result, in a shift in the high-voltage potentials HV+, HV− in relation to the reference potential M.

Although an insulation monitor in the vehicle 2 or in the DC charging station 5 monitors the insulation resistances cyclically, the time span of a maximum of 30 seconds in the vehicle 2 or a maximum of two minutes in the DC charging station 5 before an insulation fault IF is detected is far too long to be able to protect a person from a shock caused by the energy stored in the Y-capacitors CyF+, CyF−, CyL+, CyL− in the case of open insulation.

The mode of operation of the safety device 8 with its protective circuit 9 for reducing a Cy-shock is based, for example, on the limit values described in the standard SAE J1772, IEC 60479-1 and IEC60479-2 with regard to the hazard potential. In this case, the harmful parameter is the charge quantity which flows through the human body MK and is shown in a diagram. The aim is therefore to detect and reduce the body current as quickly as possible in order to minimize the charge that flows through. Actuation of the mechanical charging contactors LS+, LS− and/or main contactors HS+, HS− alone would be too slow for this purpose.

In the case of the above-described protective circuit 9, a drop in the insulation value is quickly detected by the voltage measurement, and the discharged protective capacitor Cs, Cs1, Cs2 is immediately connected in parallel to the concerned high-voltage potential HV+, HV− with body resistance $R_K$ or Y-capacitor CyF+, CyF−, CyL+, CyL− for example via a hardware connection. Thus, the voltage across this high-voltage potential HV+, HV− and the reference potential M decreases abruptly. The current flow through the human body MK decreases proportionally with the voltage reduction.

The discharge resistor Re, Re1, Re2 has two functions. Firstly, it ensures that the protective capacitor Cs, Cs1, Cs2 is completely discharged before it is activated. Secondly, after activation, it accelerates the reduction of the already reduced voltage between this high-voltage potential HV+, HV− and the reference potential M, whereby the current through the human body MK is further reduced as the voltage continues to fall. The respective other high-voltage potential HV−, HV+ increases its voltage in relation to the reference potential M to the same extent, but is not touched by the human body MK and is thus not critical. In a further step, the main contactors HS+, HS− of the high-voltage battery 6, the contactors in the DC charging station 5 and/or the charging contactors LS+, LS− can be opened and, in a final step, the X-capacitor Cx and the Y-capacitors CyF+, CyF− of the vehicle 2 can be actively discharged. However, as described above, in the solution described here, the contactors are not opened, at least not by the safety device 8, but rather the protective capacitor Cs, Cs1, Cs2 is quickly discharged in the manner described above by means of the fast discharge resistor Rse, Rse1, Rse2, whereby the protective circuit 9 is quickly ready for use again.

The safety device 8 with its protective circuit 9 can be used to comply with predefined standards, for example the standard IEC 60479-1. The higher the DC charging voltage, the higher the voltage applied across the Y-capacitors CyF+, CyF−, CyL+, CyL−. In the case of an assumed body resistance $R_K$, this also results in a higher current proportional to the voltage of the Y-capacitors CyF+, CyF−, CyL+, CyL− when they are first touched. The current through the body decreases over the course of a capacitor discharge via a resistor, in particular in the form of an exponential function. The current at the start of the contact is calculated from the quotient of voltage and resistance. In the case of an assumed maximum charging voltage of 920 V and a high-voltage potential distribution that is also assumed to be symmetrical in relation to the reference potential M (460V across each Y-capacitor), the initial value of the contact current is 460 V/1200 ohms=383 mA. Starting from this initial value of the current, this current can be converted to a sinusoidal AC current by dividing by root 6. This corresponds to the value on the X axis in the so-called C1 characteristic curve in the standard SAE J 1772. The time duration of this current can be determined by calculating the time constant of the capacitor discharge t=R×C. The corresponding time duration (Y axis) corresponds to 3×t. For example, a dwell time in this state of approx. 100 ms is still permissible. A residual body current of less than 5 mA was selected as a target, i.e., the residual voltage must be less than 6 V.

The higher the voltage across a Y-capacitor CyF+, CyF−, CyL+, CyL−, for example in the case of an asymmetrical high-voltage potential distribution in relation to the reference potential M, the shorter the maximum dwell time. A current above 500 mA is not permitted, because a maximum voltage of 600 V across a Y-capacitor CyF+, CyF−, CyL+, CyL− would occur in this case. The charging process must be aborted above this value.

The safety device 8 with its protective circuit 9 can therefore be used to calculate whether it is still able to maintain the required maximum current time durations. If this condition is not met, the charging process must be aborted immediately, as a further fault would endanger a person. Input variables for this calculation are voltage measurements across the Y-capacitors CyF+, CyF−, CyL+, CyL− of both high-voltage potentials HV+, HV−, knowledge of the circuit's own reaction speed and the table of values of the maximum permissible current dwell times.

Since the protective circuit 9 can provide an equivalent discharge path to the body current each time a high-voltage potential HV+, HV− is touched in quick succession, it is advantageously provided that the safety device 8 described here, in particular the protective circuit 9 thereof, is designed in such a way that it is able to be activated independently, i.e., to close the first and/or second circuit breaker SS1, SS2, and to open the respective closed circuit breaker SS1, SS2 again after a short dwell time in this activated state. Communication within the vehicle 2 to a superordinate control unit, which carries out measures such as opening contactors, in particular charging contactors LS+, LS− and/or main contactors HS+, HS−, and discharging the Y-capacitors CyF+, CyF−, CyL+, CyL−, is advantageously dispensed with here. The detection of a permanently applied insulation fault, i.e. a low insulation resistance and not, for example, a defective protective sheath of a high-voltage cable, is advantageously detected by another device, for example by an insulation monitor and/or by a measurement of a high-voltage potential distribution, which is not part of the safety device 8 described here and its protective circuit 9 and is also not connected with this. As mentioned, the safety device 8 described here and its protective circuit 9 are able to trip repeatedly at very short intervals and thus also in the event of rapidly recurring contact by a person, thus ensuring protection for the person. Accidental tripping, for example due to EMC interference, does not lead to further measures in the vehicle 2, such as an erroneous switch-off of the high-voltage system. The independent functioning of the safety device 8, in particular of its protective circuit 9, means that it can be flexibly and easily integrated into an existing high-voltage system. The independent functioning moreover reduces the safety requirements placed on the safety device 8 and its protective circuit 9, for example the need for a secure functioning/communication with another control device is eliminated.

The safety device 8 can also be used in the case of a DC grid 1 without the DC charging station 5, in particular for a driving operation of the vehicle 2, an AC charging operation and for installation and servicing. The only difference to the state during DC charging is that the DC charging station 5 is missing. Examples of fault mechanisms include a defective high-voltage cable or a defective housing of a high-voltage electronic system as a result of an accident. The safety device 8 with its protective circuit 9 can also reduce the charge quantity if the high-voltage system is damaged during installation or servicing.

The protective circuit 9 for reducing the Y-shock caused by an insulation fault IF is identical to that described above. For this purpose, the safety device 8 with its protective circuit 9 is naturally arranged in the vehicle 2. The mode of operation is identical to that described above for insulation faults during the DC charging. When the reduction in the voltage between one of the high-voltage potentials HV+, HV− and the reference potential M is detected, the respective protective capacitor Cs, Cs1, Cs2 is connected and the total capacitance of the Y-capacitors CyF+, CyF−, CyL+, CyL− of the affected high-voltage potentials HV+, HV− is discharged. Moreover, the main contactors HS+, HS− of the high-voltage battery 6 are commanded to open and active discharging of the X-capacitor Cx and both Y-capacitors CyF+, CyF− of the vehicle 2 is initiated. The charging contactors LS+, LS− have already been opened beforehand and also always remain open.

FIG. 6 shows the component-optimized protective circuit 9. In the protective circuit 9 for reducing a Cy-shock it can be assumed that only one high-voltage potential HV+, HV− is connected to the reference potential M, for example the housing earth, via the body resistance $R_K$. If both high-voltage potentials HV+, HV− were connected to the reference potential M, in particular the housing earth, this would be equivalent to a short circuit of the high-voltage battery 6 or DC charging station 5 which would have to be disconnected by a fuse or a current sensor with a cut-off device controlled by the latter.

It is therefore evident that the protective circuit 9 for reducing a Cy-shock for the positive potential HV+ and the negative potential HV− is never used at the same time. Thus, a single protective capacitor Cs, discharge resistor Re, protective resistor Rs, fast discharge resistor Rse and fast discharge switch Se can be used to provide both potentials HV+, HV− with short-circuit protection, as shown in FIG. 6. This means that two protective circuit parts 9.1, 9.2 are not required. The voltage measurements by means of the two voltage measuring devices SV1, SV2 and the two circuit breakers SS1, SS2 for activating the protective circuit 9 have to be retained. FIG. 6 shows such a component optimization. This is expedient if, for example, the discharge resistor Re also has to assume larger component values due to high operating voltages or large capacitances of the Y-capacitors CyF+, CyF−, CyL+, CyL− in the vehicle 2 and the DC charging station 5.

FIG. 6 shows moreover an embodiment of the entire safety device 8 with this component-optimized protective circuit 9, i.e., without the two protective circuit parts 9.1, 9.2. The safety device 8, in particular its protective circuit 9, is reduced here to the necessary additional outlay to be integrated in the vehicle 2 or at the DC charging station 5.

Connections AHV+, AHV−, AM to the positive potential HV+, negative potential HV− and reference potential M can be kept very small, as a current in the millisecond range only flows in the event of a fault. Otherwise, the connections AHV+, AHV−, AM are current-free and are only used for the voltage measurement. The result is that the safety device 8 with its protective circuit 9 can be quickly integrated into an existing high-voltage system with only minor changes. If more planning time is available, this function can of course also be integrated into an existing device.

The protective circuit 9 thus comprises, as shown in FIG. 6, an electric series circuit consisting of the electric protective capacitor Cs, the electric protective resistor Rs and the first circuit breaker SS1 between the positive potential line HV+L and the reference potential line ML and an electric series circuit consisting of the electric protective capacitor Cs, the electric protective resistor Rs and the second circuit breaker SS2 between the negative potential line HV−L and the reference potential line ML, wherein the electric discharge resistor Re is electrically connected in parallel to the protective capacitor Cs and protective resistor Rs and an electric series circuit consisting of the electric fast discharge resistor Rse and the fast discharge switch Se is electrically connected in parallel to the protective capacitor Cs or to the protective capacitor Cs and protective resistor Rs.

In a method for operating the safety device 8, the first circuit breaker SS1 or the second circuit breaker SS2 is closed when the tripping criteria are met and opened again after the protective capacitor Cs has been charged, and then the fast discharge switch Se is closed and opened again after the protective capacitors Cs has been discharged.

In an alternative embodiment, the protective circuit 9 comprises, as shown in FIG. 5, two protective circuit parts 9.1, 9.2. The first protective circuit part 9.1 comprises an electric series circuit consisting of the first electric protective capacitor Cs1, the first electric protective resistor Rs1 and the first circuit breaker SS1 between the positive potential line HV+L and the reference potential line ML, wherein a first electric discharge resistor Re1 is electrically connected in parallel to the first protective capacitor Cs1 and first protective resistor Rs1 and an electric series circuit consisting of a first electric fast discharge resistor Rse1 and a first fast discharge switch Se1 is electrically connected in parallel to the first protective capacitor Cs1 or to the first protective capacitor Cs1 and first protective resistor Rs1. The second protective circuit part 9.2 comprises an electric series circuit consisting of a second electric protective capacitor Cs2, a second electric protective resistor Rs2 and a second circuit breaker SS2 between the negative potential line HV−L and the reference potential line ML, wherein a second electric discharge resistor Re2 is electrically connected in parallel to the second protective capacitor Cs2 and second protective resistor Rs2 and an electric series circuit consisting of a second electric fast discharge resistor Rse2 and a second fast discharge switch Se2 is electrically connected in parallel to the second protective capacitor Cs2 or to the second protective capacitor Cs2 and second protective resistor Rs2.

In the method for operating the safety device 8, the first circuit breaker SS1 is then accordingly closed when the tripping criteria are met and opened again the first protective capacitor Cs1 has been charged and then the first fast discharge switch Se1 is closed and opened again after the first protective capacitor Cs1 has been discharged, and/or the second circuit breaker SS2 is closed when the tripping criteria are met and opened again after the second protective capacitor Cs2 has been charged and then the second fast discharge switch Se2 is closed and opened again after the second protective capacitor Cs2 has been discharged.

Advantageous possible uses of the safety device 8 are described below. In vehicles 2 with a high-voltage system at the 800 V level, it is difficult to comply with the limit values prescribed by standards for discharge through Y-capacitors CyF+, CyF−, CyL+, CyL−. This is especially true of existing vehicles 2 that do not allow for any adaptations to the high-voltage system for large additional components due to the installation space already taken up in the vehicle 2. The solution described here is suitable because it is simple, cost-effective and requires little installation space in the vehicle 2.

Furthermore, the solution described fulfils regulations, in particular from standards, thereby making it easier possible or even possible to obtain approval for the vehicle 2. With this safety device 8 and its protective circuit 9, the limit values are achieved with the addition of small electronics without having to make any changes to the high-voltage system and its components.

The maximum energy content of 0.2 J required in LV123 is already exceeded 632 V by the DC charging station 5. Alternative measures are thus absolutely essential. The only solution currently being discussed is double insulation. All coupled systems, i.e. vehicle 2 and DC charging station 5, must then have increased insulation at the same time, which cannot currently be guaranteed. However, due to the safety device 8 and its protective circuit 9, the energy flowing through the human body MK can also be kept to a value below 0.2 J. It thus represents a further solution for alternative measures.

The safety device 8 and its protective circuit 9 make it possible to reduce the dangerous discharge current of the Y-capacitors CyF+, CyF−, CyL+, CyL− in the event of damaged insulation during DC charging, for example in the event of a damaged charging plug or charging cable 4. In all other vehicle states, the dangerous discharge current that occurs upon human contact if the insulation is damaged is also reduced.

Improved EMC interference suppression is possible owing to a larger design of the Y-capacitors CyF+, CyF−, CyL+, CyL−. It is possible to dispense with the requirement for the double insulation of the entire high-voltage system. This applies to vehicle 2 and DC charging station 5.

The safety device 8 with its protective circuit 9 can be arranged in the vehicle 2 and/or in the DC charging station 5.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

LIST OF REFERENCE SIGNS

1 DC grid
2 vehicle
3 high-voltage onboard electrical system
4 charging cable
5 DC charging station
6 high-voltage battery
7 battery energy source
8 safety device
9 protective circuit
9.1, 9.2 protective circuit part
12 voltage evaluation unit
13 charging station voltage source
AHV+, AHV−, AM connection
AK+, AK− connection contact
Cs, Cs1, Cs2 protective capacitor
Cx X-capacitor
CyF+, CyF− Y-capacitor vehicle
CyL+, CyL− DC charging station Y-capacitor
HS+, HS− main contactor
HV+, HV− high-voltage potential
HV+L, HV−L high-voltage potential line
IF insulation fault
LS+, LS− charging contactor
M reference potential
ML reference potential line
MK human body
$R_{Batt}$ battery internal resistor
R, R1, R2 resistor
Re, Re1, Re2 discharge resistor
$R_K$ body resistance
$R_{LS}$ charging station internal resistor
Rs, Rs1, Rs2 protective resistor
Rse, Rse1, Rse2 fast discharge resistor
Se, Se1, Se2 fast discharge switch
SS1, SS2 circuit breaker
SV1, SV2 voltage measuring device

The invention claimed is:

1. A safety device for an electric DC grid, the safety device comprising:
a first voltage measuring device arranged between a positive potential line and a reference potential line and configured to measure a voltage between the positive potential line and the reference potential line;
a second voltage measuring device arranged between a negative potential line and the reference potential line and configured to measure a voltage between the negative potential line and the reference potential line,
a protective circuit configured to reduce an electric shock caused by Y-capacitors of the electric DC grid, wherein the protective circuit comprises
a first circuit breaker between the positive potential line and the reference potential line; and
a second circuit breaker between the negative potential line and the reference potential line,
wherein a plurality of tripping criteria are predefined and the first circuit breaker or the second circuit breaker is actuatable so as to close exclusively in event of all predefined tripping criteria being met as determined by the first voltage measuring device or the second voltage measuring device,
wherein the tripping criteria comprise a voltage deviation of a voltage applied between the positive potential line and the reference potential line and a voltage applied between the negative potential line and the reference potential line from a previously determined voltage value, a voltage changes in the voltage applied between the positive potential line and the reference potential line and the voltage applied between the negative potential line and the reference potential line, the voltage applied between the positive potential line and the reference potential line is of the opposite sign to the voltage applied between the negative potential line and the reference potential line, and an absence of a cyclical repetition of other tripping criteria, wherein the first circuit breaker or the second circuit breaker are actuatable only if the voltage deviation of the voltage present between the positive potential line and the reference potential line and the voltage present between the negative potential line and the reference potential line from the previously determined voltage value exceeds a predefined limit value, and the voltage changes of the voltage applied between the positive potential line and the reference potential line and the voltage applied between the negative potential line and the reference potential line exceeds a predefined limit value, and the voltage applied between the positive potential line and the reference potential line and is of the opposite sign to the voltage applied between the negative potential line and the reference potential line, and if the absence of the cyclical repetition of the other tripping criteria is determined.

2. The safety device of claim 1, wherein the first or second voltage measuring device is configured to perform an analog or digital evaluation of voltage.

3. The safety device of claim 1, further comprising:
a common voltage evaluation unit coupled to the first and second voltage measuring devices and to first and second the circuit breakers, wherein the common voltage evaluation unit is configured to
evaluate the voltage determined by the first voltage measuring device and the voltage determined by the second voltage measuring device, and
actuate the first circuit breaker or the second circuit breaker exclusively in the event of all predefined tripping criteria are met as determined by the first voltage measuring device or the second voltage measuring device.

4. The safety device of claim 1, wherein the first and second circuit breakers are semiconductor switches.

5. The safety device of claim 1, wherein the safety device is a component of a high-voltage onboard electrical system of a vehicle.

6. An electric vehicle or hybrid vehicle comprising:
an onboard electrical system comprising a safety device, which comprises
a first voltage measuring device arranged between a positive potential line and a reference potential line and configured to measure a voltage between the positive potential line and the reference potential line;
a second voltage measuring device arranged between a negative potential line and the reference potential line and configured to measure a voltage between the negative potential line and the reference potential line, a protective circuit configured to reduce an electric shock caused by Y-capacitors of the electric DC grid, wherein the protective circuit comprises
a first circuit breaker between the positive potential line and the reference potential line; and
a second circuit breaker between the negative potential line and the reference potential line,
wherein a plurality of tripping criteria are predefined and the first circuit breaker or the second circuit breaker is actuatable so as to close exclusively in event of all predefined tripping criteria being met as determined by the first voltage measuring device or the second voltage measuring device,
wherein the tripping criteria comprise
a voltage deviation of a voltage applied between the positive potential line and the reference potential line and a voltage applied between the negative potential line and the reference potential line from a previously determined voltage value,
a voltage changes in the voltage applied between the positive potential line and the reference potential line and the voltage applied between the negative potential line and the reference potential line,
the voltage applied between the positive potential line and the reference potential line is of the opposite sign to the voltage applied between the negative potential line and the reference potential line, and
an absence of a cyclical repetition of other tripping criteria,
wherein the first circuit breaker or the second circuit breaker are actuatable only if
the voltage deviation of the voltage present between the positive potential line and the reference potential line and the voltage present between the negative potential line and the reference potential line from the previously determined voltage value exceeds a predefined limit value, and
the voltage changes of the voltage applied between the positive potential line and the reference potential line and the voltage applied between the negative potential line and the reference potential line exceeds a predefined limit value, and
the voltage applied between the positive potential line and the reference potential line and is of the opposite sign to the voltage applied between the negative potential line and the reference potential line, and
if the absence of the cyclical repetition of the other tripping criteria is determined.

7. A high-voltage DC charging station, comprising:
a safety device, which comprises
a first voltage measuring device arranged between a positive potential line and a reference potential line and configured to measure a voltage between the positive potential line and the reference potential line;
a second voltage measuring device arranged between a negative potential line and the reference potential line and configured to measure a voltage between the negative potential line and the reference potential line,
a protective circuit configured to reduce an electric shock caused by Y-capacitors of the electric DC grid, wherein the protective circuit comprises
a first circuit breaker between the positive potential line and the reference potential line; and a second circuit breaker between the negative potential line and the reference potential line, wherein a plurality of tripping criteria are predefined and the first circuit breaker or the second circuit breaker is actuatable so as to close exclusively in event of all predefined tripping criteria being met as determined by the first voltage measuring device or the second voltage measuring device, wherein the tripping criteria comprise a voltage deviation of a voltage applied between the positive potential line and the reference potential line and a voltage applied between the negative potential line and the reference potential line from a previously determined voltage value, a voltage changes in the voltage applied between the positive potential line and the reference potential line and the voltage applied between the negative potential line and the reference potential line, the voltage applied between the positive potential line and the reference potential line is of the opposite sign to the voltage applied between the negative potential line and the reference potential line, and an absence of a cyclical repetition of other tripping criteria, wherein the first circuit breaker or the second circuit breaker are actuatable only if the voltage deviation of the voltage present between the positive potential line and the reference potential line and the voltage present between the negative potential line and the reference potential line from the previously determined voltage value exceeds a predefined limit value, and the voltage changes of the voltage applied between the positive potential line and the reference potential line and the voltage applied between the negative potential line and the reference potential line exceeds a predefined limit value, and the voltage applied between the positive potential line and the reference potential line and is of the opposite sign to the voltage applied between the negative potential line and the reference potential line, and if the absence of the cyclical repetition of the other tripping criteria is determined.

* * * * *